United States Patent
Matsuda et al.

(10) Patent No.: US 7,515,624 B2
(45) Date of Patent: Apr. 7, 2009

(54) SEMICONDUCTOR LASER, SEMICONDUCTOR LASER DRIVER AND METHOD OF DRIVING SEMICONDUCTOR LASER REDUCING FEEDBACK-INDUCED NOISE BY MODULATED OPTICAL OUTPUT

(75) Inventors: Kyoko Matsuda, Nara (JP); Toshiyuki Okumura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 117 days.

(21) Appl. No.: 10/697,001

(22) Filed: Oct. 31, 2003

(65) Prior Publication Data
US 2004/0091009 A1 May 13, 2004

(30) Foreign Application Priority Data
Nov. 11, 2002 (JP) ............................ 2002-327148
Aug. 7, 2003 (JP) ............................ 2003-206544

(51) Int. Cl.
*H01S 5/00* (2006.01)
(52) U.S. Cl. .................... 372/50.1; 372/26; 372/45.013
(58) Field of Classification Search .................. 372/12, 372/122, 21, 26, 45.013, 50.12, 50.122, 50.21, 372/50.1
See application file for complete search history.

(56) References Cited

U.S. PATENT DOCUMENTS 5,283,799 A * 2/1994 Jacquet et al. ........... 372/50.22
5,394,260 A * 2/1995 Suzuki et al. ............... 398/185
5,574,369 A * 11/1996 Hibbs ......................... 324/248
6,205,161 B1 * 3/2001 Kappeler ................... 372/38.1

FOREIGN PATENT DOCUMENTS

| JP | 60-35344 A | 2/1985 |
| JP | 62-241389 A | 10/1987 |
| JP | 2-137383 A | 5/1990 |
| JP | 05-160509 A | 6/1993 |
| JP | 8-204282 A | 8/1996 |
| JP | 2000-286504 A | 10/2000 |

OTHER PUBLICATIONS

Giacomelli et al., "Noise enhancement of telegraph signals in vertical cavity surface emitting lasers," IEEE Quantum electronics conference, Sep. 10-15, 2000.*

* cited by examiner

*Primary Examiner*—Minsun Harvey
*Assistant Examiner*—Tod T Van Roy
(74) *Attorney, Agent, or Firm*—Birch, Stewart, Kolasch & Birch, LLP

(57) ABSTRACT

A semiconductor laser device has an active layer which is divided into two regions in the direction of a resonator, i.e., a light-amplifying region and a saturable absorber region. The light-amplifying region and the saturable absorber region are produced to allow the semiconductor laser device to be in a bistable state. For the light-amplifying region and the saturable absorber region respectively, p-electrodes are separately and independently formed. N-electrodes are provided in relation to the p-electrodes. From one of the p-electrodes, a current which is modulated with noise added thereto is injected.

6 Claims, 13 Drawing Sheets tion relates to a semiconductor laser, a semiconductor laser driver and a method of driving a semiconductor laser reducing feedback-induced noise by a modulated optical output.

SEMICONDUCTOR LASER, SEMICONDUCTOR LASER DRIVER AND METHOD OF DRIVING SEMICONDUCTOR LASER REDUCING FEEDBACK-INDUCED NOISE BY MODULATED OPTICAL OUTPUT

This Nonprovisional application claims priority under 35 U.S.C. 119(a) on patent application Ser. No(s). 2002-327148 and 2003-206544 filed in Japan on Nov. 11, 2002 and Aug. 7, 2003, respectively, the entire contents of which are hereby incorporated by reference.

BACKGROUND OF THE INVENTION

1. Field of the Invention

The present invention relates to a semiconductor laser, a semiconductor laser driver and a method of driving a semiconductor laser. In particular, the present invention relates to a semiconductor laser, a semiconductor laser driver and a method of driving a semiconductor laser reducing feedback-induced noise by a modulated optical output.

2. Description of the Background Art

Semiconductor lasers are superior in monochromaticity and directivity and can provide a necessary spot size which is small enough to read a pit on an optical disk, and are accordingly used as a light source for the optical disk. For such a high-density recording medium as DVD (Digital Versatile Disk) having a multi-layer structure, a high output of at least 8 mW is necessary for reading and thus conventional red semiconductor lasers cannot be used for the high-density recording medium.

A nitride semiconductor laser with a short wavelength and a high output power is appropriate for the high-density recording medium like the DVD, and thus development of the nitride semiconductor laser, which is to be used as an effective laser for a laser pickup device instead of the red semiconductor laser, is being in progress.

With such a pickup device, light emitted from a laser is reflected from a surface of a disk which is a recording medium or from an optical system, and then the emitted light is partially returned to the laser. The light returned to the laser is called "feedback light." The feedback light and the light emitted from the laser interfere with each other, resulting in noise generation when information is reproduced.

An effective method for reducing "feedback-induced noise" is to periodically change the intensity of an optical output and thereby reduce the coherency of the semiconductor laser. An optical output with its light intensity periodically changed is hereinafter referred to as "modulated optical output."

In order to produce the modulated optical output, a technique of intentionally causing "self pulsation" of the laser is generally employed. The self pulsation can be caused by providing, for example, the laser with such a special structure as described below.

Around a gain region within an active layer that is called light-amplifying region, a region having a light-absorbing effect that is called saturable absorber region is formed. Accordingly, on carriers in the active layer and oscillating light, the Q-switching effect is exerted by the saturable absorber region to cause the self pulsation.

Thus, a constant current equal to or larger than a lasing threshold can be injected into the active layer of the laser with the above-described structure so as to intentionally cause the self pulsation and thereby obtain a modulated optical output.

FIG. 11 is a cross-sectional view exemplarily showing a structure of a conventional self-pulsating semiconductor laser.

The conventional self-pulsating semiconductor laser device shown in FIG. 11 includes, on an n-type GaAs substrate 103, an n-type GaAs buffer layer 104, an n-type AlGaInP cladding layer 105, a GaInP active layer 106, a p-type AlGaInP cladding layer 107, a p-type GaInP intermediate layer 108 and a p-type GaAs contact layer 109 that are deposited successively in this order.

P-type AlGaInP cladding layer 107, p-type GaInP intermediate layer 108 and p-type GaAs contact layer 109 constitute a stripe ridge 110, and n-type GaAs buried layers 111 and 112 are provided respectively on lateral sides of ridge 110. A p-electrode 101 is provided on the front side of the device and an n-electrode 102 is provided on the back side thereof that are not divided.

This device has ridge 110 in cladding layer 107 located on active layer 106 so as to produce regions into which currents of different amounts respectively are injected, and thus saturable absorber regions 114 and 115 are provided around a light-amplifying region 113 (gain region) to achieve the self pulsation.

Here, a current is injected from p-electrode 101 through the inside of ridge 110 into the active layer 106 and then passed to n-electrode 102. The current is chiefly injected into a region directly below the ridge that accordingly functions as a light-amplifying region 113 while a smaller amount of current is injected into regions 114 and 115 that accordingly function as saturable absorber regions. In this way, the self pulsation is caused.

For such a device, various parameters of the device structure that can cause the self pulsation, for example, the width of the ridge structure and the thickness of the cladding layer, should be determined. Moreover, unless the device is precisely produced to satisfy the determined conditions, the self pulsation is impossible to achieve.

A conventional nitride semiconductor laser device is shown next that has a region into which a smaller amount of current is injected, i.e., saturable absorber region, as the conventional device shown in FIG. 11.

FIG. 12 is a cross-sectional view showing a structure of the conventional nitride semiconductor laser device disclosed in Japanese Patent Laying-Open No. 2000-286504.

The conventional nitride semiconductor laser device shown in FIG. 12 is produced by depositing, on a sapphire substrate 121, an n-type contact layer 122 of GaN having a thickness of 4.5 μm, an n-type cladding layer 123 of $Al_bGa_{1-b}N$ having a thickness of 0.8 μm, an active layer 124 having a multiple quantum well structure, a p-type cladding layer 125 of $Al_aGa_{1-a}N$ having a thickness of 0.8 μm, n-type current-constricting layers 126 and 127 of $Al_cGa_{1-c}N$, and a p-type contact layer 128 of GaN having a thickness of 0.05 μm.

P-type cladding layer 125 is constituted of a flat portion 125a formed to cover a surface of active layer 124 and a two-stripe portion constituted of a lower stripe portion 125b and an upper stripe portion 125c protruding upward from the central part of flat portion 125a. The top surface of the two-stripe portion contacts p-type contact layer 128 and the lateral sides thereof contact n-type current-constricting layers 126 and 127. Here, the width of upper stripe portion 125c is made smaller than the width of lower stripe portion 125b.

On n-type contact layer 122, an n-electrode 129 is formed. On p-type contact layer 128, a p-electrode 130 is formed. In active layer 124, well layers of $In_xGa_{1-x}N$ having a thickness of 8 nm and barrier layers of $In_yGa_{1-y}N$ having a thickness of 16 nm are stacked alternately. In the device structure shown in FIG. 12, n-type current-constricting layers 126 and 127 made of $Al_cGa_{1-c}N$ has a refractive index which is made smaller than that of p-type cladding layer 125 made of $Al_aGa_{1-a}N$ ($0<a<c\leqq1$) and thereby a real-refractive-index waveguide structure is implemented.

This conventional nitride semiconductor laser device efficiently uses, as a saturable absorber region, the region into which a smaller amount of current is injected. Then, the ridge is formed so that the width of the ridge for current injection and the width of a region where a transverse mode of laser light spreads are different from each other. Neither P-electrode 130 nor n-electrode 129 is divided. P-electrode 130 is formed on the top surface of p-type contact layer 128 while n-electrode 129 is formed on the top surface of n-type contact layer 122 and they are provided as a pair of electrodes.

According to the above-discussed method, a region into which a smaller amount of current is injected is used as the saturable absorber region. Alternatively, a saturable absorber region and a light-amplifying region may be provided in advance in fabricating the device. In this case, the carrier lifetime and the differential gain are adjusted by adding impurities so as to satisfy the parameter conditions for causing the self pulsation and accordingly, a layer serving as the saturable absorber region and a layer serving as the light-amplifying region are produced. Such a conventional self-pulsating semiconductor laser is shown in FIG. 13.

FIG. 13 is a cross-sectional view showing a structure of a self-pulsating semiconductor laser device disclosed in Japanese Patent Laying-Open No. 8-204282.

The conventional self-pulsating semiconductor laser device shown in FIG. 13 includes an n-electrode 141, an n-type GaAs substrate 142, an n-type AlGaInP cladding layer 143, an n-type AlGaInP saturable absorber layer 144, an n-type AlGaInP cladding layer 145, an AlGaInP active layer 146, a p-type AlGaInP cladding layer 147, a p-type AlGaInP saturable absorber layer 148, a p-type AlGaInP cladding layer 149, n-type GaAs current-blocking layers 150 and 151, a p-type GaAs contact layer 152 and a p-electrode 153.

This laser device has saturable absorber layers 144 and 148 in itself that have the light-absorbing effect, and carriers in these saturable absorber layers 144 and 148, and carriers and oscillating light in active layer 146 which is a light-amplifying region cooperate with each other to cause self-pulsation. The laser satisfying the self-pulsating condition can produce an optical output with a periodical change in intensity, which is achieved by injection of direct current into the light-amplifying region.

When the above-discussed method is used to cause the self pulsation, however, the composition of the device and conditions of the structure thereof are limited. For example, in order to fabricate saturable absorber layers 144 and 148 and active layer 146 which is a light-amplifying region by adding impurities thereto, the carrier lifetime and the differential gain of the saturable absorber regions and the light-amplifying region should be adjusted.

According to the methods as described above, the intensity of an optical output is periodically changed by using the self pulsation. There is another method for producing a modulated optical output, which is specifically a high-frequency superimposition method according to which a current modulated by the high frequency is injected. For example, according to a technique disclosed in Japanese Patent Laying-Open No. 60-35344, pulsed lasing is caused by superimposing a modulation current of high frequency on an operating current near a lasing threshold of a laser.

FIG. 14 illustrates operational characteristics of the conventional semiconductor laser disclosed in Japanese Patent Laying-Open No. 60-35344.

In FIG. 14, (a) indicates an injection-current to optical-output characteristic curve of the conventional semiconductor laser, with the horizontal axis representing an injection current and the vertical axis representing an optical output produced according to the injection current. To the semiconductor laser having such an injection-current to optical-output characteristics, a current modulated in a range between a current value smaller than a lasing threshold Ith and a current value higher than the lasing threshold Ith as indicated by (b) in FIG. 14 is injected, so that an optical output of the semiconductor laser is modulated as indicated by (c) in FIG. 14.

In this case, it is unnecessary to cause the self pulsation state and thus unnecessary to form a structure having the saturable absorber region and light-amplifying region in fabricating the device. Moreover, the amplitude of the modulation current to be injected can be increased to increase the amplitude of a resultant modulated optical output.

There is a further method of producing a modulated optical output, according to which a semiconductor laser in a bistable state with a light-amplifying region and a saturable absorber region is provided and a current or voltage to be applied to the saturable absorber region is varied.

FIG. 15 shows characteristics of an injection current injected into a light-amplifying region vs. an optical output of a conventional semiconductor laser in a bistable state.

As shown in FIG. 15, the conventional semiconductor laser in the bistable state exhibits hysteresis characteristics in the relation between the injection current and the optical output. The solid line indicated by A is herein referred to as lower hysteresis path and the dotted line indicated by B is herein referred to as upper hysteresis path.

Referring to FIG. 15, as a current is injected into the light-amplifying region only, the optical output increases from P4 through P1 along the path indicated by A. At this time, the carrier density in the saturable absorber region increases because of absorption of light generated in the light-amplifying region, and accordingly, the light-absorbing effect in the saturable absorber region decreases.

Then, as the amount of a current injected into the light-amplifying region increases, the light-absorbing effect reaches saturation. Then, when the injection current attains IthON, the optical output suddenly increases from P1 to P2. This IthON is herein referred to as rising threshold of hysteresis.

Then, as the amount of the injection current is decreased, the optical output gradually decreases from P2 through P3 along the path indicated by B, since the saturable absorber region cannot immediately recover the light-absorbing effect and thus the optical output does not dramatically decrease. At this time, as the carrier density as well as the optical output decrease, the light absorbing effect of the saturable absorber region is recovered.

Then, as the amount of the injection current injected into the light-amplifying region is decreased, the light-absorbing effect is sufficiently recovered so that the optical output sharply decreases from P3 to P4 when the injection current reaches IthOFF. IthOFF is herein referred to as falling threshold of hysteresis.

The shape of the hysteresis paths changes according to voltage application or current injection to the saturable absorber region. When a voltage is applied to or a current is injected into the saturable absorber region, the carrier density increases and the light-absorbing effect decreases. Then, the whole hysteresis shifts to a region where the injection current is lower, so that IthON decreases. In this way, by increasing/decreasing the light-absorbing effect of the saturable absorber region, the lasing threshold can be changed. A conventional driving method of this type as described above is shown in FIGS. 16 and 17.

FIG. 16 is a schematic cross-sectional view showing a structure of a conventional semiconductor laser device in a bistable state disclosed in Japanese Patent Laying-Open No. 2-137383.

The conventional bistable semiconductor laser shown in FIG. 16 is a transverse-mode-controlled semiconductor laser of AlGaAs/GaAs formed on a GaAs substrate. One of electrodes of the laser is divided to provide a light-amplifying region 161 and a saturable absorber region 162 in an active layer 163. Then, according to voltages V1 and V2 applied to saturable absorber region 162, a lasing threshold current injected into light-amplifying region 161 is varied. In other words, a bias current IB applied to light-amplifying region 161 is set to an intermediate value of lasing thresholds according to voltages V1 and V2, and a signal voltage V which changes between V1 and V2 is applied to saturable absorber region 162.

FIG. 17 shows an injection current—optical output characteristic curve of the conventional bistable semiconductor laser shown in FIG. 16.

Since saturable absorber region 162 which is a loss for oscillating light is provided in active layer 163, the optical output non-linearly increases at a current value, when a current is injected into light-amplifying region 161 only. This lasing threshold current Ih1 or Ih2 changes according to the amount of light absorbed in saturable absorber region 162. The threshold current decreases as the amount of absorbed light increases. When the voltage applied to the saturable absorber region increases from V1 to V2 (V1<V2), the amount of absorbed light in saturable absorber region 162 accordingly increases so that the lasing threshold current decreases from Ih1 to Ih2.

Thus, as shown in FIGS. 16 and 17, a certain bias current IB (Ih2<IB <Ih1) is injected into light-amplifying region 161 while a signal voltage V changing from V1 to V2 is applied to saturable absorber region 162, so that the lasing threshold current varies between Ih1 and Ih2 to produce a modulated optical output P.

The conventional art shown in FIGS. 11-13 according to which a modulated optical output is produced by using self pulsation has a problem that the composition and structure of the device are limited in fabricating the device.

If the composition in fabricating the device is utilized to provide a saturable absorber region and a light-amplifying region, the ratio between the saturable absorber region and the light-amplifying region in terms of carrier lifetime as well as in terms of differential gain must be adjusted. However, the range of parameters satisfying the self pulsation condition is narrow so that the freedom of fabrication is lessened. In particular, the nitride semiconductor laser shown in FIG. 12 confronts a serious problem that the value of the differential gain cannot be changed to a great degree due to characteristics of the nitride.

In general, the balance of the carrier density between the saturable absorber region and the light-amplifying region determines whether the semiconductor laser enters a self-pulsating state or bistable state. The balance can be adjusted by using the ratio in terms of the length in the direction of the resonator, the ratio in terms of the carrier lifetime and the ratio in terms of the differential gain, between these regions. In a laser in the self-pulsating state, the carrier lifetime of the light-amplifying region should be longer than that of the saturable absorber region and the differential gain of the light-amplifying region should be smaller than that of the saturable absorber region. Then, it is necessary that the ratio in terms of the differential gain and the ratio in terms of the carrier lifetime are in specific ranges respectively.

Specific values of these parameters vary depending on characteristics of a semiconductor. For a nitride semiconductor laser, the ratio of the differential gain between the saturable absorber region and the light-amplifying region must be made larger than that of a GaAs-based red semiconductor laser for example. It is noted that, if there is a greater difference between the saturable absorber region and the light-amplifying region in terms of the gradient of a gain characteristic curve with respect to the carrier density, namely the differential gain, the self pulsation is more easily caused.

More specifically, a greater gradient of a gain characteristic curve with respect to the carrier density in the saturable absorber region makes it possible to change the carrier density with less absorption of light. Accordingly, the carrier density can be changed easily. A great change in carrier density in the saturable absorber region causes a change in light-absorbing effect. For the nitride semiconductor laser, however, it is extremely difficult to provide different differential gains respectively of the saturable absorber region and the light-amplifying region due to characteristics of the nitride.

FIG. 18 shows gain characteristic curves in a saturable absorber region and a light-amplifying region of semiconductor lasers. The solid line represents gain characteristics of a GaAs semiconductor laser and the broken line represents gain characteristics of a GaN semiconductor laser.

Carriers of the GaN semiconductor laser have a larger effective mass than that of carriers of a red semiconductor laser. Regarding the GaN semiconductor laser, as shown in FIG. 18, the difference in gradient between the section of the gain characteristic curve in the saturable absorber region (absorbing region) and that in the light-amplifying region (gain region) is smaller than that of the GaAs semiconductor laser which is a red semiconductor laser. Therefore, the ratio between differential gains respectively in those regions represented by the inclination of the gain characteristic curve is approximately 1 and thus the laser cannot satisfy the self-pulsating condition. Moreover, the nitride semiconductor laser including the GaN semiconductor laser has a problem that it is difficult to change the differential gain by addition of impurities, in contrast to the red semiconductor laser.

For the reason above, it is difficult to produce the nitride semiconductor laser by adjusting the carrier lifetime and the differential gain so as to allow the saturable absorber region and the light-amplifying region to satisfy the self-pulsating condition. No method has been found to surely cause the self pulsation.

In addition, as shown in FIG. 12, when the ridge is provided in the structure of the nitride semiconductor laser so as to produce regions into which different amounts of currents are injected and thereby produce a saturable absorber region and a light-amplifying region, numerous and detailed conditions in terms of the structure, such as the width and thickness of the ridge, the thickness of the multi-layer along the boundary of the ridge, the thickness of the cladding layer and etching conditions, must be optimized. Moreover, technique for precisely fabricating the device under the resultant conditions is necessary.

Then, in order to achieve the self pulsation by the structure as shown in FIG. 12, many conditions should be defined first. Even if the conditions are established, there remains a problem that the yield of products is poor due to unsatisfactory technique of fabricating the devices. Thus, regarding the nitride semiconductor laser, there has been no method for manufacturing a laser device producing the self-pulsating state.

Regarding the method as shown in FIG. 14 that is a high-frequency superimposing method for obtaining a modulated optical output without using the self-pulsating state, a great amplitude of a modulation current to be injected is necessary for producing an optical output with an amplitude required for achieving the effect of reducing noise. A resultant problem is that, when a great optical output which is necessary to be applied to a pickup device for a high-density recording medium is produced, power consumption and generated heat increases.

Further, regarding the method as shown in FIG. 15 of increasing/decreasing the voltage to be applied to the saturable absorber region of a bistable semiconductor laser and increasing/decreasing the resistance thereof so as to adjust the lasing threshold of the laser and thereby produce a modulated optical output, it is necessary to apply a voltage or current of a large amplitude to the saturable absorber region in order to produce an optical output of a large amplitude which is enough to reduce feedback light. However, if the voltage or current of a large amplitude is applied to the saturable absorber region, a high voltage or current must be applied accordingly.

Then, when a modulated optical output is to be produced by the method as shown in FIG. 15, it is likely that the saturable absorber region saturates and thus an optical output has a small change in intensity. As a result, the optical output has a small amplitude and further, a pulsed optical output is hard to produce. Accordingly, the coherence is difficult to reduce, which lowers the effect of removing feedback-induced noise.

The problems of conventional techniques discussed above are summarized as follows.

For such a high-density recording medium as DVD which has a multi-layer structure, an output of at least 8 mW is required even for reading. Therefore, conventional GaAs-based self-pulsating semiconductor lasers cannot be used for such a medium.

Instead of the conventional semiconductor lasers, a nitride semiconductor laser is now being developed for use as a next-generation device. Although the nitride semiconductor laser produces a high output, this laser is difficult to produce due to a narrow range of conditions for achieving the self-pulsating state. For a conventional semiconductor laser having a ridge in its structure for providing a saturable absorber region and thereby producing the self-pulsating state, it is difficult to specify conditions of the structure. Moreover, the self-pulsating state cannot be produced unless the device is precisely fabricated, and thus the yield is poor.

For a conventional semiconductor laser into which an injection current modulated to be temporarily lower than the lasing threshold is injected so as to obtain a pulsed optical output, if the maximum value of the current is increased for producing an optical output having an amplitude which is large enough to reduce feedback-induced noise, the amplitude of the modulation current must be increased, resulting in a problem of a greater load on a modulating circuit.

Moreover, for a conventional semiconductor laser for which a voltage to be applied to the saturable absorber region of the semiconductor laser in the bistable state is increased/decreased in order to modulate an optical output, the lasing threshold of the laser must be switched with a wide range for producing a high optical output necessary for a pickup device of a high-density recording medium. Then, as the lasing threshold is increased, the value of current to be injected into the light-amplifying region should be increased.

SUMMARY OF THE INVENTION

An object of the present invention is to provide a semiconductor laser, a semiconductor laser driver and a method of driving a semiconductor laser, with a device structure easy to produce, low power consumption and reduced feedback-induced noise.

The present invention according to one aspect is a semiconductor laser reducing feedback-induced noise by a modulated optical output, and includes an active layer having a light-amplifying region and a saturable absorber region formed to allow the semiconductor laser to be in a bistable state, an electrode of a first polarity, and an electrode of a second polarity provided in relation to the electrode of the first polarity. At least one of the electrode of the first polarity and the electrode of the second polarity is divided to allow a current to be injected independently into the light-amplifying region and the saturable absorber region.

Preferably, the active layer has two light-amplifying regions formed on lateral sides respectively of the saturable absorber region, and the two light-amplifying regions have respective emission surfaces of the semiconductor laser.

More preferably, the current is generated by superimposing a noise current on a modulation current, and the intensity of the modulation current and the intensity of the noise current are adjusted with respect to each other so as to allow the modulated optical output to have a large amplitude and achieve an effect of reducing the feedback-induced noise.

Still more preferably, the modulation current has a rectangular wave.

Still more preferably, the noise current has a random intensity change.

Still more preferably, a ratio of the length of the saturable absorber region to the entire length of a resonator in the direction of the resonator is at least 1% and at most 50%.

Still more preferably, a difference between a maximum value and a minimum value of the noise current is at most an amplitude of the modulation current injected into the light-amplifying region.

A semiconductor laser according to another aspect of the present invention includes a buffer layer formed on a substrate, a contact layer of a first conductivity type formed on the buffer layer and having a cut formed in the contact layer, first and second electrodes of the first conductivity type formed on the contact layer of the first conductivity type and separated from each other by the cut, a cladding layer of the first conductivity type formed on the contact layer of the first conductivity type without being separated by the cut, an active layer formed on the cladding layer of the first conductivity type, a cladding layer of the second conductivity type formed on the active layer, first and second contact layers of the second conductivity type formed on the cladding layer of the second conductivity type separately from each other, a first electrode of the second conductivity type formed on the first contact layer of the second conductivity type, and a second electrode of the second conductivity type formed on the second contact layer of the second conductivity type.

Preferably, the substrate is made of sapphire, the buffer layer is made of GaN, the contact layer of the first conductivity type is made of GaN, the active layer has a multiple quantum well structure formed of an $In_{0.2}Ga_{0.8}N$ quantum well layer and an $In_{0.05}Ga_{0.95}N$ barrier layer, and the contact layer of the second conductivity type is made of GaN.

The present invention according to still another aspect is a semiconductor laser driver driving a semiconductor laser reducing feedback-induced noise by a modulated optical output, and the driver includes the semiconductor laser, a modulation current supply circuit supplying a modulation current to the semiconductor laser, and a noise current supply circuit supplying a noise current to the semiconductor laser. The semiconductor laser includes an active layer having a light-amplifying region and a saturable absorber region formed to allow the semiconductor laser to be in a bistable state, an electrode of a first polarity, and an electrode of a second polarity provided in relation to the electrode of the first polarity. At least one of the electrode of the first polarity and the electrode of the second polarity is divided to allow a current to be injected independently into the light-amplifying region and the saturable absorber region.

Preferably, the active layer has two light-amplifying regions formed on lateral sides respectively of the saturable absorber region, the two light-amplifying regions have respective emission surfaces of the semiconductor laser, and the semiconductor laser driver further includes, in order to control light which is output from one of the emission surfaces of the semiconductor laser, a monitor unit monitoring light which is output from the other emission surface of the semiconductor laser.

More preferably, the current is generated by superimposing a noise current on a modulation current, and the intensity of the modulation current and the intensity of the noise current are adjusted with respect to each other so as to allow the modulated optical output to have a large amplitude and achieve an effect of reducing the feedback-induced noise.

Still more preferably, the modulation current has a rectangular wave.

Still more preferably, the noise current has a random intensity change.

Still more preferably, a difference between a maximum value and a minimum value of the noise current is at most an amplitude of the modulation current injected into the light-amplifying region.

Still more preferably, the noise current supply circuit includes a photoelectric conversion element converting light output from the semiconductor laser into an electric signal, a high-pass filter extracting only a frequency component higher than a modulation frequency of the modulation current from the electric signal which is output from the photoelectric conversion element, and a preamplifier adjusting the electric signal having the high-frequency component extracted by the high-pass filter to inject the adjusted electric signal as the noise current into the semiconductor laser.

Still more preferably, the driver further includes a coupling unit coupling the modulation current with the noise current to inject a resultant current into the light-amplifying region of the semiconductor laser, and a constant current supply circuit injecting a constant current into the saturable absorber region of the semiconductor laser.

The present invention according to a further aspect is a semiconductor-laser driving method for driving a semiconductor laser reducing feedback-induced noise by a modulated optical output. The method includes the steps of converting light which is output from the semiconductor laser into an electric signal, extracting, from the electric signal, only a frequency component higher than a modulation frequency of a modulation current to be injected into the semiconductor laser, and adjusting the electric signal of the extracted high-frequency component to inject, into the semiconductor laser, the adjusted electric signal as noise current to be injected into the semiconductor laser.

Preferably, a difference between a maximum value and a minimum value of the noise current is at most an amplitude of the modulation current injected into a light-amplifying region of the semiconductor laser.

The present invention according to a further aspect is a semiconductor-laser driving method for driving a semiconductor laser reducing feedback-induced noise by a modulated optical output. The method includes the steps of coupling a modulation current with a noise current to inject a resultant current into a light-amplifying region of the semiconductor laser, and injecting a constant current into a saturable absorber region of the semiconductor laser.

Preferably, a difference between a maximum value and a minimum value of the noise current is at most an amplitude of the modulation current injected into the light-amplifying region.

Thus, according to the present invention, a bistable semiconductor laser which is easier to produce as compared with a self-pulsating semiconductor laser can be used to produce high-power laser light with lower power consumption, a smaller load on the circuitry and excellent noise characteristics, and thereby reduce feedback-induced noise.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
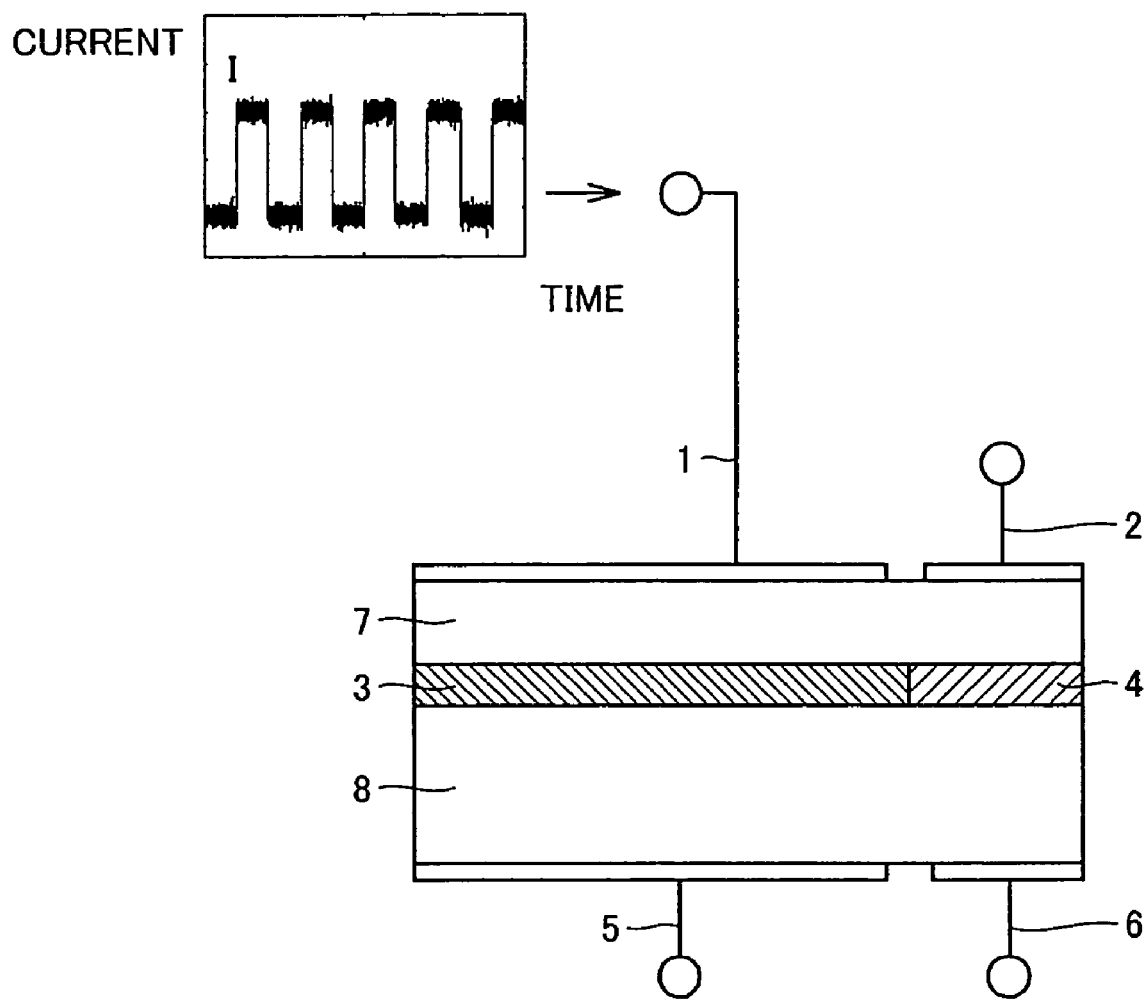
FIG. 1 is a schematic side cross-sectional view of a resonator of a nitride semiconductor laser according to a first embodiment of the present invention.

Embodiments of the present invention are hereinafter described in detail with reference to the drawings. It is noted that like components are denoted by like reference characters in the drawings and description thereof is not repeated here.

First Embodiment

FIG. 1 is a schematic side cross-sectional view of a resonator of a nitride semiconductor laser according to a first embodiment of the present invention.

The nitride semiconductor laser device of the first embodiment shown in FIG. 1 uses an n-type gallium substrate 8, and an active layer is divided in the direction of the resonator into two regions, i.e., a light-amplifying region 3 and a saturable absorber region 4. Light-amplifying region 3 and saturable absorber region 4 are produced to satisfy conditions that allow the semiconductor laser to be in a bistable state. Here, the length of saturable absorber region 4 in the direction of the resonator is approximately 10% of the entire length of the resonator.

In addition, for light-amplifying region 3 and saturable absorber region 4 respectively, p-electrodes 1 and 2 are provided separately and independently of each other and a common p-type cladding layer 7 is provided under p-electrodes 1 and 2. From this p-electrode 1, an injection current I which is modulated and to which noise is added is injected. Injection current I is detailed hereinlater. Moreover, n-electrodes 5 and 6 are provided respectively for p-electrodes 1 and 2. Above n-electrodes 5 and 6, n-type gallium substrate 8 is provided that serves as a common n-type cladding layer.

Since the active layer is divided into the two regions, i.e., light-amplifying region 3 and saturable absorber region 4 and the upper and lower electrodes are divided according to the division of the active layer, the resultant structure facilitates independent control of injection of currents respectively into light-amplifying region 3 and saturable absorber region 4. Thus, interference can be avoided between the current flowing through saturable absorber region 3 and the current flowing through light-amplifying region 4. Although both of the upper and lower electrodes are shown to be divided, this is merely an example. It is enough that at least one of the upper and lower electrodes is divided so that independent injection of the current can be done.

Respective lengths of light-amplifying region 3 and saturable absorber region 4 in the direction of the resonator as well as the carrier lifetime and the differential gain of each of the regions are defined to satisfy conditions for ensuring a bistable state. Then, by injection of a current into light-amplifying region 3, the semiconductor laser enters the bistable state.

In contrast to the self-pulsating state, the bistable state does not require a high differential-gain ratio between the light-amplifying region and the saturable absorber region. Therefore, the bistable state can easily be produced in a nitride semiconductor laser. In addition, to satisfy conditions for ensuring a bistable state means that the product of the carrier-lifetime ratio and the differential-gain ratio between the light-amplifying region and the saturable absorber region is a certain value or less. Then, parameters of the carrier lifetime and the differential gain may be selected from a wide range and accordingly the degree of freedom of selection increases. Even if the differential-gain ratio cannot be adjusted, the carrier-lifetime ratio may appropriately be adjusted to produce the bistable state.

In this way, the bistable state can easily be produced in the nitride semiconductor laser. Therefore, even the nitride semiconductor laser in which the self-pulsating state is difficult to establish can produce a modulated optical output in the bistable state.

Further, a very small modulation current which is almost equal to a lasing threshold together with noise can be injected into light-amplifying region 3 to generate a modulated optical output from the semiconductor laser in the bistable state even if the operating current of the laser is almost equal to the lasing threshold of the laser. Then, with smaller power consumption as compared with that of the conventional devices, feedback-induced noise can be reduced. In particular, since even the nitride semiconductor laser in which the self-pulsating state is difficult to establish can produce a modulated optical output, the nitride semiconductor laser can readily be applied to a high-density recording medium which requires at least 8 mV even for reading.

According to the first embodiment, impurities are added to a region in the active layer that is to serve as saturable absorber region 4 in order to adjust the carrier lifetime. Here, as the impurities, $1 \times 10^{19}$ cm$^{-3}$ of Si is added.

An operation of the first embodiment is now described. A current which has a non-periodic and random change in intensity and is injected as noise for modulation current into the active layer is herein referred to as "additional noise" which should be distinguished from "feedback-induced noise."

Figure 2A:
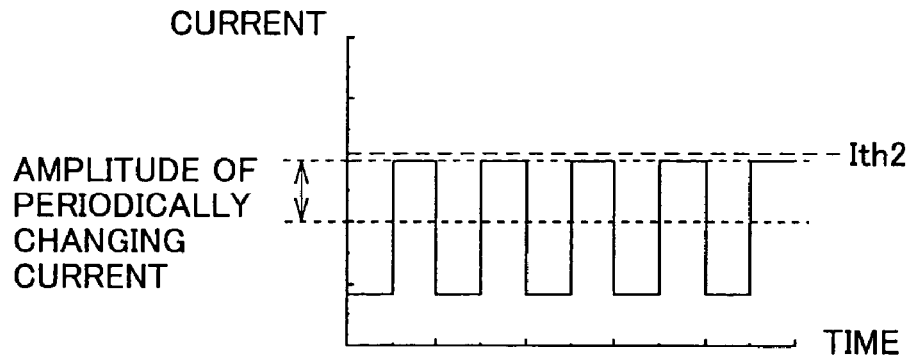
FIGS. 2A, 2B and 2C illustrate a current which is injected into an active layer of the nitride semiconductor laser according to the first embodiment of the present invention.
Figure 2B:
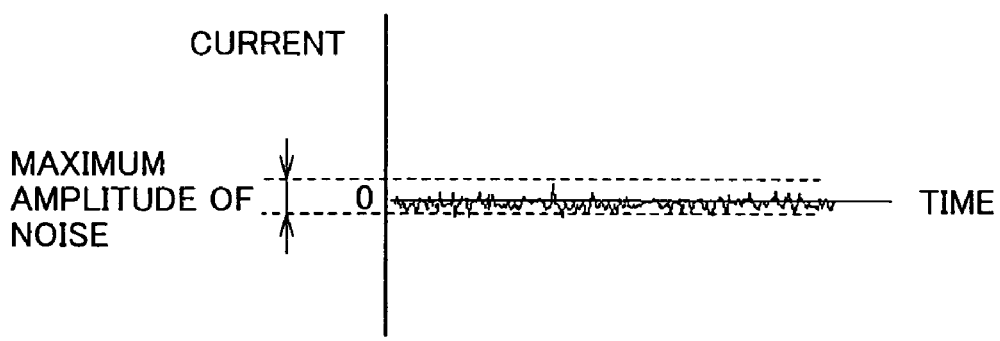
Figure 2C:
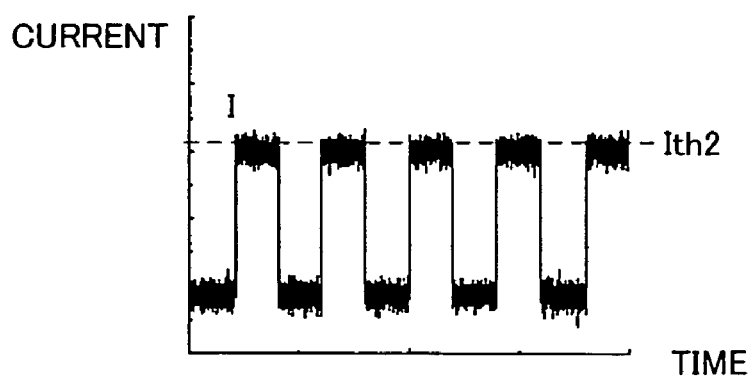

FIGS. 2A, 2B and 2C illustrate an injection current I injected into the active layer of the nitride semiconductor laser according to the first embodiment of the present invention.

FIG. 2A shows a time waveform of a modulation current with a rectangular wave, FIG. 2B shows a time waveform of a current to which noise is added (additional noise). FIG. 2C shows a time waveform of a current which is the modulation current in FIG. 2A on which the additional noise in FIG. 2B is superimposed. The current shown in FIG. 2C is used as injection current I to be injected into the active layer of the nitride semiconductor laser of the first embodiment.

Injection current I is injected independently into light-amplifying region 3 and saturable absorber region 4 via p-electrodes 1 and 2 respectively. As described above, this injection current I is produced by adding white noise to a modulation current which is produced by superimposing a high-frequency current on a DC operating current. Injection current I is injected via p-electrode 1 into light-amplifying region 3.

The modulation current is a current modulated by a rectangular wave, and the frequency of the modulation current is approximately 100 MHz. A constant current to be injected into saturable absorber region 4 is 1.0 mA. Here, in terms of the injection-current to optical-output characteristics, the rising threshold of the hysteresis is 20 mA and the falling threshold thereof is 16 mA. Then, the maximum and minimum values of the modulation current to be injected into light-amplifying region 3 are set respectively to 19.7 mA and 15 mA.

It is noted that, a half of the difference between the maximum value and the minimum value of the modulation current having a periodic intensity change is herein referred to as "amplitude" of the modulation current, and the difference between the maximum value and the minimum value of the noise shown in FIG. 2B is herein referred to as "maximum amplitude of noise."

Figure 3:
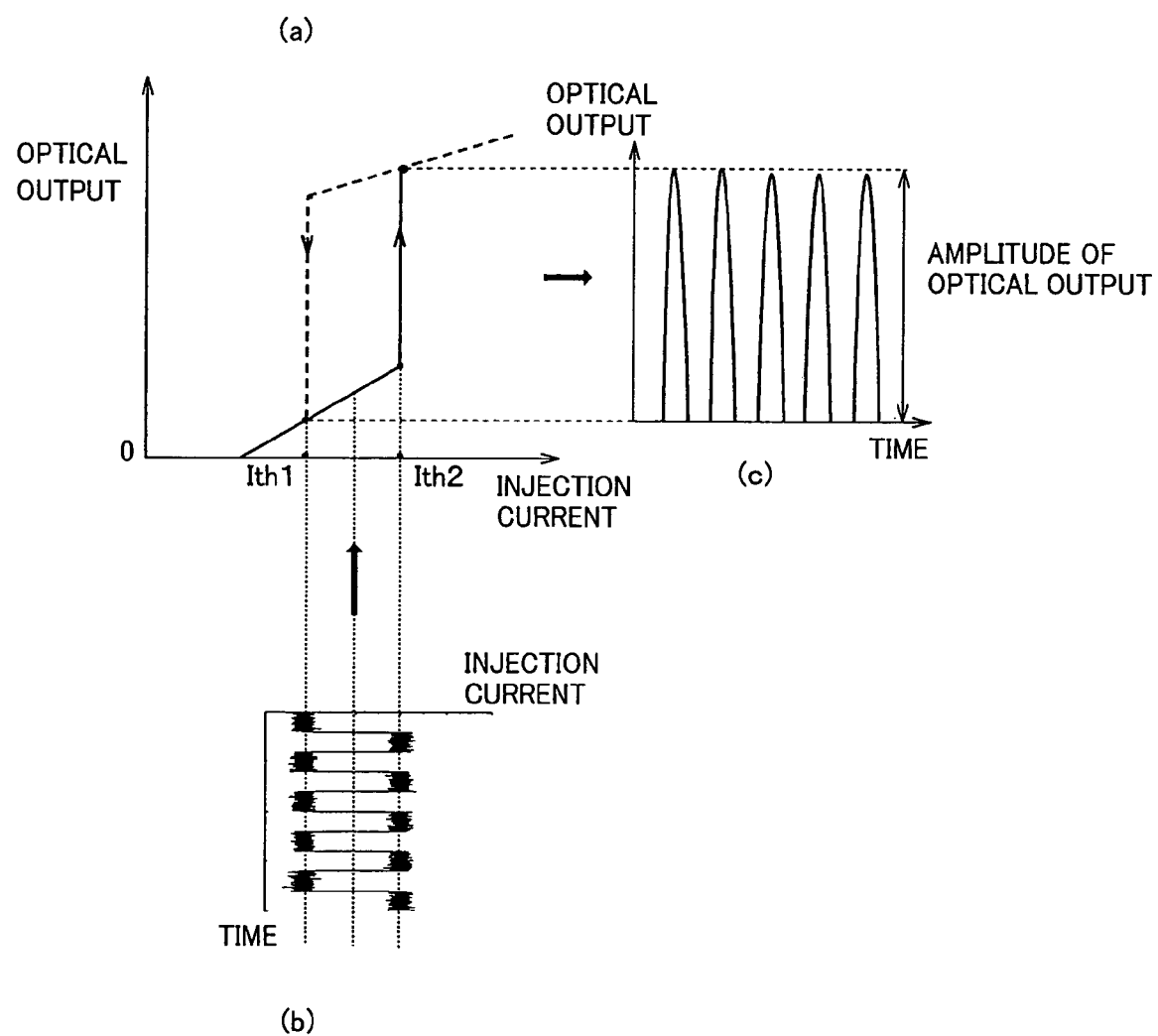
FIG. 3 illustrates operational characteristics of the nitride semiconductor laser according to the first embodiment of the present invention.
Figure 14:
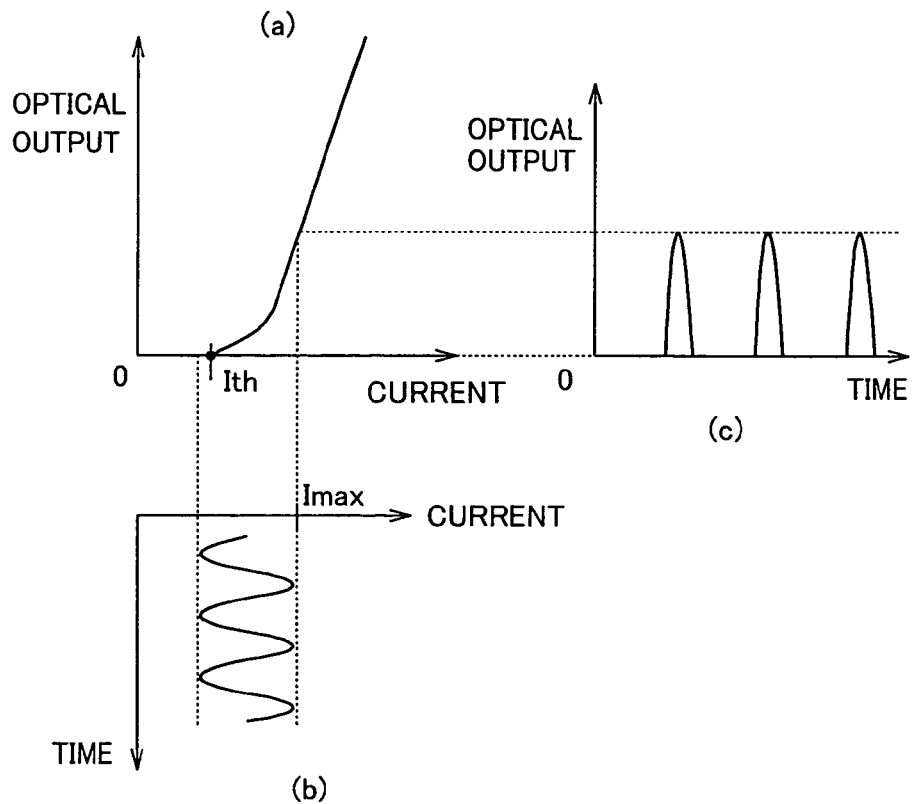
FIG. 14 illustrates operational characteristics of a conventional semiconductor laser.
Figure 15:
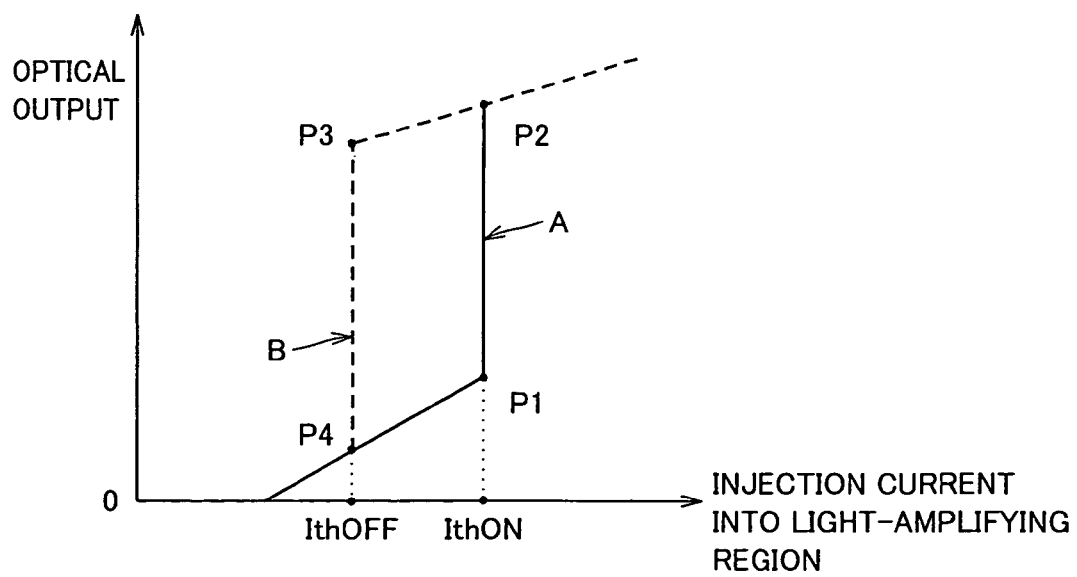
FIG. 15 shows characteristics of an injection current injected into a light-amplifying region vs. optical output of a conventional bistable semiconductor laser.
Figure 16:
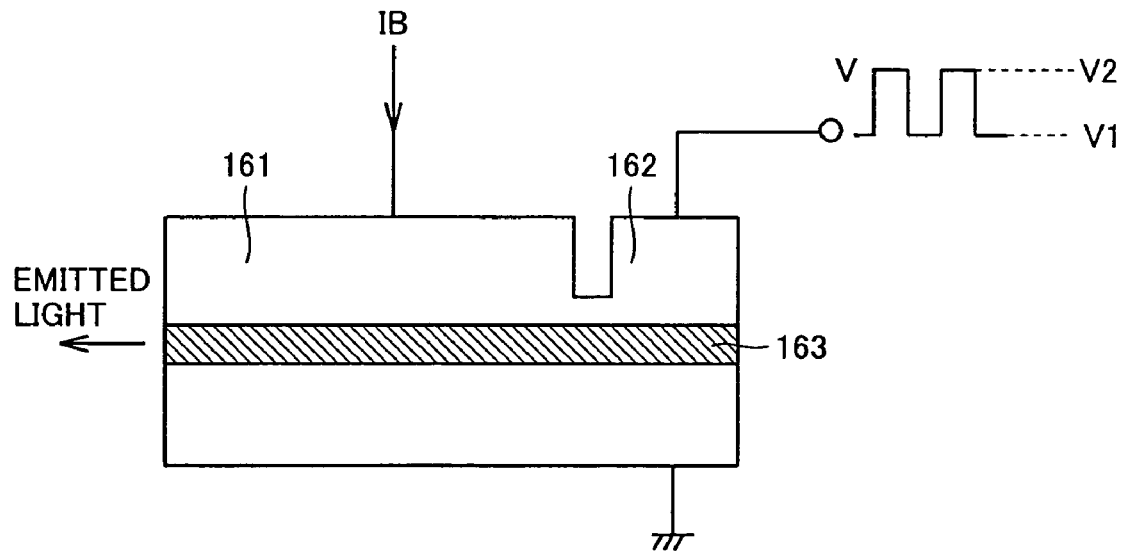
FIG. 16 is a schematic cross-sectional view showing a structure of a conventional bistable semiconductor laser device.
Figure 17:
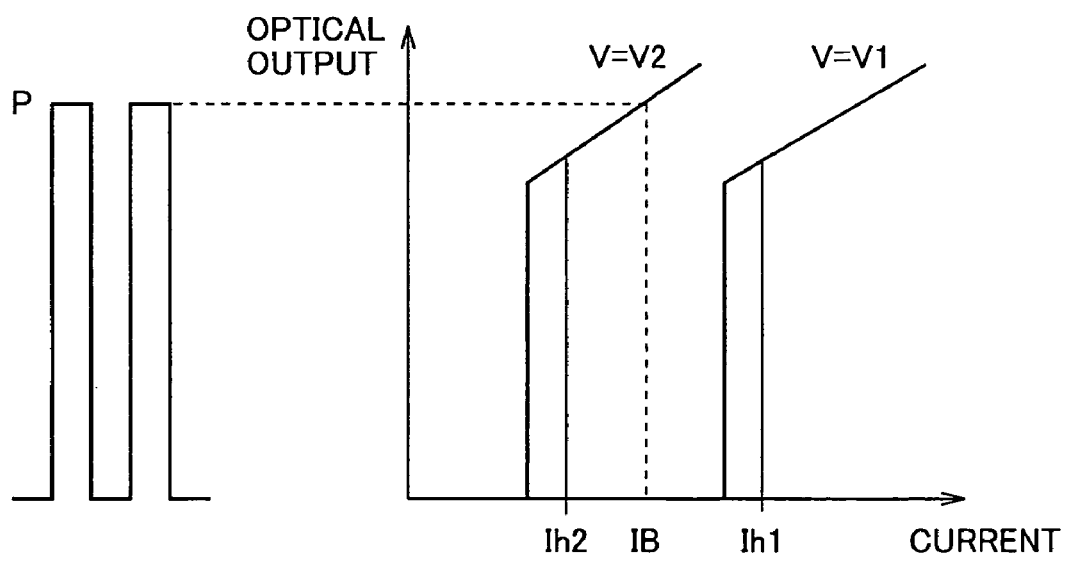
FIG. 17 shows a characteristic curve of injection current vs. optical output of the conventional bistable semiconductor laser shown in FIG. 16.
Figure 18:
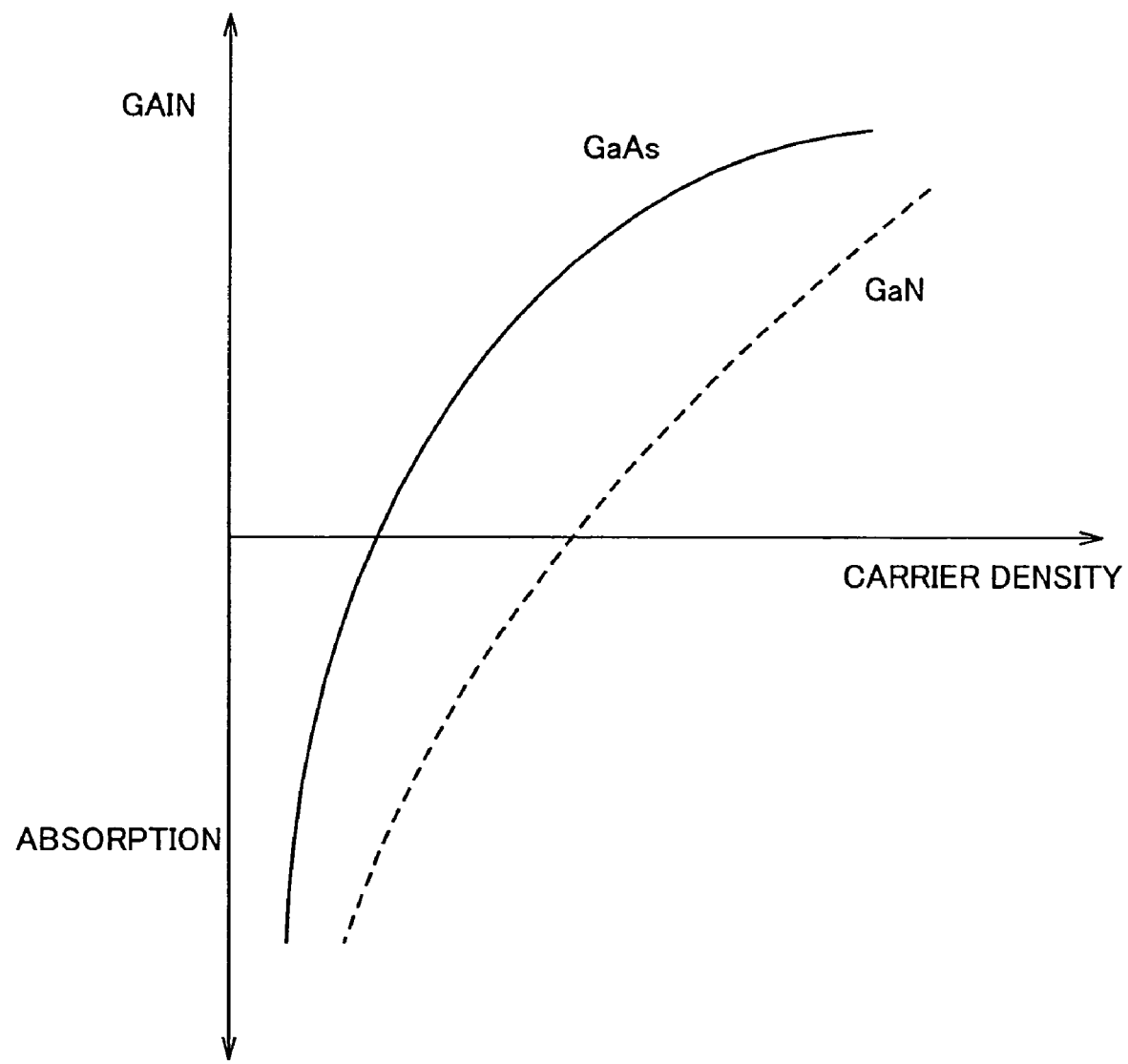
FIG. 18 shows gain characteristic curves in a saturable absorber region and a light-amplifying region of semiconductor lasers.

FIG. 3 illustrates operational characteristics of the nitride semiconductor laser according to the first embodiment of the present invention (see together with FIG. 14).

In FIG. 3, (a) shows injection-current to optical-output characteristics of the semiconductor laser, the horizontal axis representing an injection current while the vertical axis representing an optical output generated according to the injection current. In FIG. 3, (b) shows the time waveform of injection current I described in connection with FIG. 2C. In FIG. 3, (c) shows a time waveform of the optical output resultant from injection of injection current I shown by (b) into the semiconductor laser.

Under (a) in FIG. 3, Ith 1 indicates a value of the current at which the state of the optical output makes a transition from the lower hysteresis path represented by the solid line to the upper hysteresis path represented by the broken line, namely a rising threshold of the hysteresis. Ith2 indicates a value of the current at which the state of the optical output makes a transition from the upper hysteresis path to the lower hysteresis path, namely a falling threshold of the hysteresis. Rising threshold Ith2 of the hysteresis is indicated by the broken lines in FIGS. 2A and 2C.

As shown in FIG. 2A, the maximum intensity of the modulation current to which noise has not been added is set to an intensity lower than rising threshold Ith2 of the hysteresis. Therefore, injection of the modulation current shown in FIG. 2A into the active layer merely causes the optical output to stay on the lower hysteresis path on the injection-current to optical-output characteristic curve and the optical output cannot make a transition to the upper hysteresis path.

By adding the additional noise shown in FIG. 2B to the modulation current in FIG. 2A, the maximum value of the modulation current to which the additional noise is added becomes higher than rising threshold Ith2 of the hysteresis as shown in FIG. 2C. Then, after the modulation current reaches the maximum value, it becomes lower than Ith2 again and makes a transition to the lower hysteresis path. When the transition occurs between the upper hysteresis path and the lower hysteresis path, the optical output suddenly increases/decreases.

Accordingly, as shown by (c) in FIG. 3, a modulated optical output with a great amplitude with its intensity periodically modulated can be produced. Here, the intensity of the additional noise is appropriately adjusted to be injected so that an effect of reducing feedback-induced noise is achieved by means of the optical output.

Reasons for the above are that, an excessively low intensity of the additional noise cannot allow the transition to the upper hysteresis path so that an optical output having an amplitude necessary for reducing feedback-induced noise cannot be obtained and that, an excessively high intensity of the additional noise causes transition to the upper hysteresis irrespective of the cycle of the appearance of the maximum value of the modulation current and consequently the intensity of the optical output changes at random and thus feedback-induced noise cannot be reduced.

In this way, the intensity of the additional noise is appropriately adjusted so as to achieve the effect of reducing feedback-induced noise by the optical output, and then injected into the light-amplifying region. The modulation current is adjusted to a value which is extremely small to the degree that an optical output resultant from injection of only this modulation current into the light-amplifying region has merely an extremely small value corresponding to the lower hysteresis path and thus feedback-induced noise cannot be reduced. When the maximum value of the modulation current and the current which is the additional noise injected into the light-amplifying region together with the modulation current are stochastically synchronized and consequently the modulation current attains its maximum, transition to the upper hysteresis path can occur and accordingly the output amplitude increases and thus an optical output of a large amplitude can be obtained.

By such a considerably small injection current, a modulated optical output with a large amplitude can thus be produced. The modulated optical output having an output power of 10 mW at the maximum and a large amplitude can accordingly be obtained by the modulation current. As a result, the effect of reducing feedback-induced noise can be achieved. Moreover, since the current is injected into saturable absorber region 4 independently of the current injected into light-amplifying region 3, the hysteresis can be controlled to decrease the lasing threshold and thereby drive the laser with a lower current or adjust the amplitude of the optical output.

The intensity of the additional noise is appropriately adjusted and then added to the modulation current. Thus, the value of the current to be injected is changed at random around the central value of the modulation current. Then, the maximum value of the modulation current and a change of the intensity of the additional noise are stochastically synchronized and accordingly, a temporal transition to the upper hysteresis path can occur. In this way, a modulation current which is small to the degree that the transition to the upper hysteresis path is impossible can be injected to produce an optical output with a large amplitude.

Here, if a periodic signal, instead of the noise, is added to the modulation current to make the transition to the upper hysteresis-path, an optical output with a large amplitude can only be obtained when respective cycles of the periodic signals exactly match or the cycle of one of the signals is precisely a multiple of the cycle of the other signal so that respective maximum values are synchronized with each other. In such a case, if the waveform fluctuates due to thermal noise of the circuit for example, the effect of reducing feedback-induced noise is deteriorated.

In contrast, noise having its intensity changing at random does not have fixed cycle or frequency range and thus the noise is less influenced by fluctuations of current, therefore, the effect of reducing feedback-induced noise can be ensured. Moreover, there is an advantage that generation of the noise requires lower power consumption than generation of the periodic signal.

Figure 4:
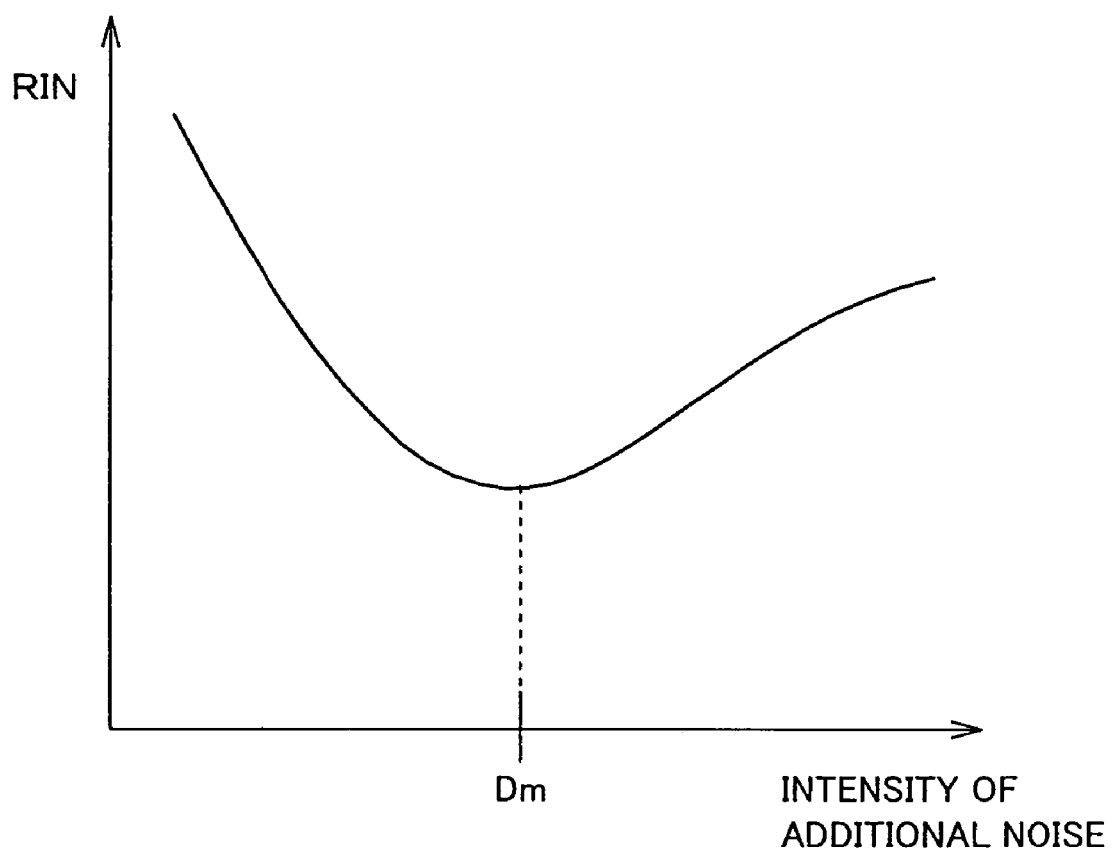
FIG. 4 shows a relative noise intensity (RIN) of an optical output with respect to feedback light, when the intensity of additional noise is varied.

FIG. 4 shows a relative noise intensity (RIN) of an optical output with respect to feedback light, when the intensity of additional noise is varied.

As shown in FIG. 4, RIN has its minimum value when the intensity of the noise current is equal to an optimum noise intensity Dm. According to the first embodiment, the noise current having this optimum noise intensity Dm is added to the modulation current which is to be injected into the light-amplifying region. Thus, the noise with the appropriate intensity causes the extremely small modulation current to make a transition to the upper hysteresis path and accordingly a modulated optical output having a large amplitude can be produced. According to the first embodiment, the intensity of the additional noise is adjusted to set the maximum amplitude of the additional noise to 0.5 mA so that the intensity is equal to optimum noise intensity Dm which allows RIN to be minimum.

Figure 5A:
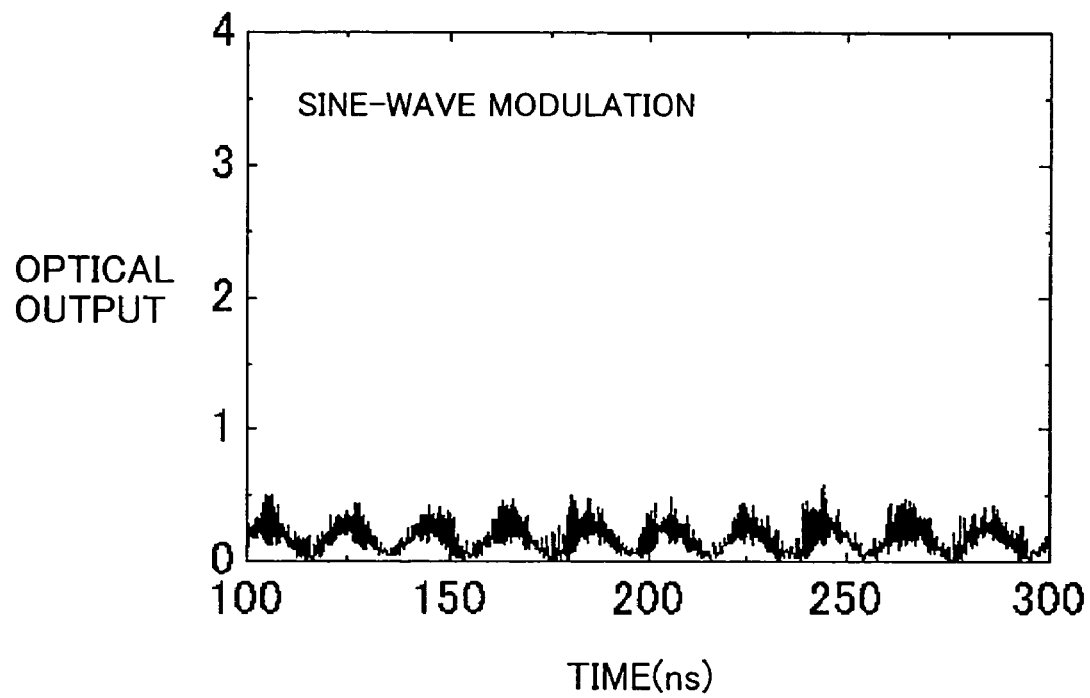
FIG. 5A shows an optical output when a modulation current has a sine wave and FIG. 5B shows an optical output when the modulation current has a rectangular wave.
Figure 5B:
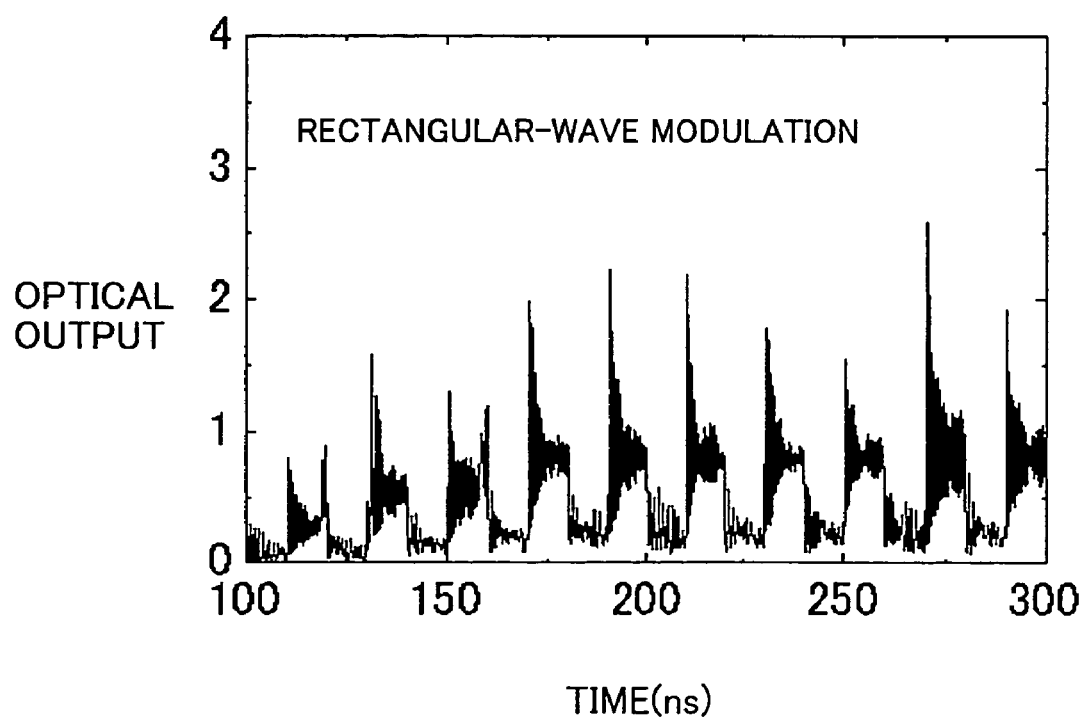

FIG. 5A shows an optical output when a modulation current with a sine wave is used, and FIG. 5B shows an optical output when a modulation current with a rectangular wave is used. From a comparison between FIGS. 5A and 5B, it is seen that modulation by means of the rectangular wave in FIG. 5B produces a greater optical output and a sharper pulse of the waveform.

Figure 6:
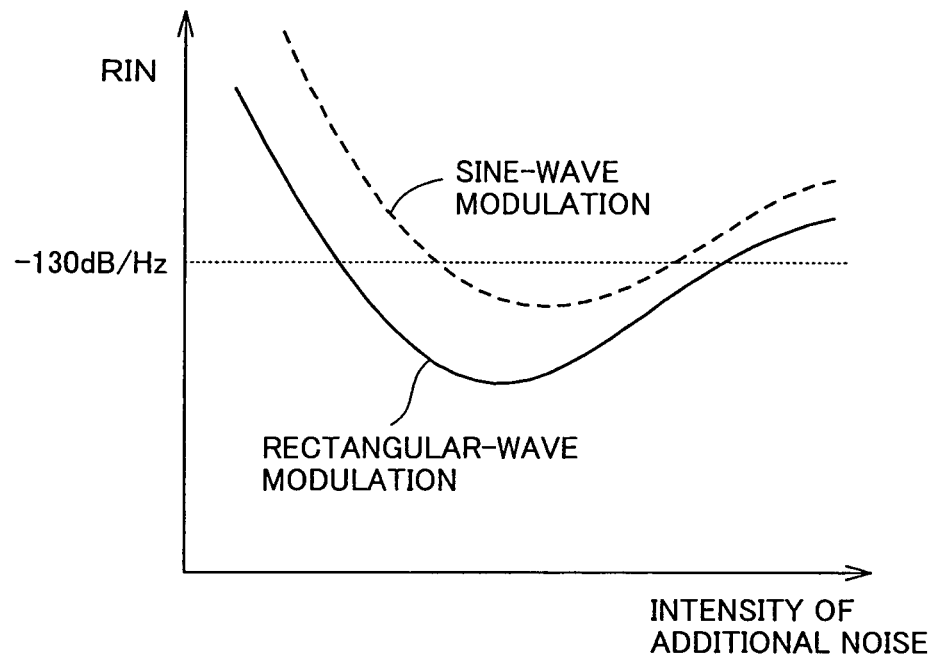
FIG. 6 shows dependency of the relative noise intensity (RIN) on the additional noise intensity in the first embodiment.

FIG. 6 shows dependency of the relative noise intensity (RIN) on the intensity of the additional noise according to the first embodiment.

The solid line in the graph represents modulation by a rectangular wave and the broken line represents modulation by a sine wave. For reading of an optical disk, RIN should be equal to or lower than −130 dB/Hz. The modulation by the rectangular wave provides a greater range which allows RIN to be equal to or lower than −130 dB/Hz, as compared with the modulation by the sine wave. Moreover, the minimum value of RIN obtained through the modulation with the rectangular wave is smaller than that through the modulation with the sine wave.

The rectangular wave can thus be used to increase the amplitude of the optical output and thus obtain the modulated optical output with a lower current. Further, a wider range of the additional noise intensity can be used in driving the laser. Then, a wide range of parameters can be provided in driving, and noise can readily be reduced.

The length of saturable absorber region 4 in the direction of the resonator may not be approximately 10% of the entire length of the resonator as defined according to the first embodiment. With other lengths, a modulated output with the same output power and waveform can be produced and the similar effect to that of the first embodiment can be achieved.

If the ratio of the length of saturable absorber region 4 to the entire length of the resonator in the direction thereof is smaller, it becomes difficult to achieve the bistable state of the semiconductor laser. In particular, if a semiconductor laser having the ratio of the length which is less than 1% is to be manufactured, the manufacturing process is troublesome and selection of diffusion materials is difficult. Therefore, the ratio of the length of saturable absorber region 4 to the entire length of the resonator in the direction thereof is preferably at least 1%.

On the contrary, if the ratio of the length of saturable absorber region 4 to the entire length of the resonator in the direction of the resonator is larger, the lasing threshold current accordingly increases. In particular, if the ratio exceeds 50%, the power consumption considerably increases resulting in an increase of generated heat.

In addition, if the ratio of the length of saturable absorber region 4 to the entire length of the resonator in the direction thereof increases, the injection current should be increased to optimize the shape of the hysteresis. In particular, if the ratio exceeds 50%, a considerable increase in power consumption and a resultant increase in generated heat occur. Further, if the shape of the hysteresis is not optimum, the effect of reducing feedback-induced noise by stochastic resonance decreases and an optical output response deteriorates.

For the reasons above, the ratio of the length of saturable absorber region 4 in the direction of the resonator to the entire length of the resonator is preferably at least 1% and at most 50%, which facilitates establishment of the bistable state, decreases the lasing threshold current and allows the shape of the hysteresis to appropriately be determined. In addition, with smaller power consumption and smaller heat generation, advantages are obtained that the effect of reducing noise by stochastic resonance is achieved and that conditions for fabricating the device can readily be satisfied.

Although white noise is used as the additional noise in the first embodiment, any noise having its intensity changing non-periodically and randomly can be employed to achieve the effect of reducing noise similar to that of the first embodiment.

Moreover, the modulation of the operating current to be injected into light-amplifying region 3 may be of any wave except for the rectangular wave. However, the modulation by the rectangular wave provides a greater change in carrier density within the active layer so that a higher optical output and a sharper pulse waveform can be produced. Thus, the rectangular wave is preferred since the amplitude of the optical output can be improved and driving can be done with lower current. In the first embodiment, the amplitude of the additional noise is set to 0.5 mA so that the intensity of the additional noise is equal to the optimum noise intensity Dm which allows RIN to be minimum. However, the noise intensity is not limited to such a value on the condition that a resultant optical output has a value of the RIN that is required for the optical disk pickup.

In this case, according to the first embodiment, if the maximum amplitude of the current, which is the additional noise, is equal to or smaller than the width of the hysteresis shown by the injection-current to optical-output characteristics of the semiconductor laser, namely the difference (Ith2−Ith1) between the rising threshold and the falling threshold of the hysteresis, a modulated optical output can be produced.

If the additional noise is too strong, the waveform of the optical output could distort and thus the stochastic resonance does not occur. At any rate, if the maximum amplitude of the additional noise current is larger than the amplitude of the modulation current, the waveform and cycle of the modulation current cannot be reproduced and consequently an input signal cannot be detected. In contrast, if the maximum amplitude of the additional noise current is smaller than the amplitude of the modulation current, the amplitude of the optical output can further be increased, the value of RIN can be improved and the effect of reducing noise can be enhanced. Therefore, such an additional noise current is preferable.

The frequency of the modulation current injected into light-amplifying region 3 may not be approximately 100 MHz which is used in the first embodiment, and thus may be any frequency which can produce a modulated optical output having the effect of reducing feedback-induced noise.

Although the value of the modulation current which is injected into light-amplifying region 3 is 19.7 mA at the maximum in the first embodiment, the value is not limited to this. Suppose that there is an injection-current to optical-output characteristic curve when a certain current is injected into saturable absorber region 4. Then, if a modulation current supplied to light-amplifying region 3 has its intensity to the degree that transition to the upper hysteresis path does not occur, the effect similar to that of the first embodiment is achieved.

In the first embodiment, the value of the modulation current supplied to light-amplifying region 3 is 15 mA at the minimum. The value is not limited to this. Suppose that there is an injection-current to optical-output characteristic curve when a certain current is injected into saturable absorber region 4. Then, if the minimum value of the modulation current supplied to light-amplifying region 3 is equal to the rising threshold Ith2 or smaller of the hysteresis, a resultant optical output has the effect of reducing noise. However, if the minimum value of the modulation current injected into light-amplifying region 3 is equal to or smaller than the falling threshold Ith1 of the hysteresis, the minimum value of the optical output decreases and the amplitude of the optical output increases so that the effect of reducing noise can be improved.

In the first embodiment, the value of the injection current injected into saturable absorber region 4 is 1.0 mA. The value, however, is not limited to this. If the width of the hysteresis of the injection-current to optical-output characteristic curve of the semiconductor laser, which is determined by the value of the injection current to the saturable absorber region, is equal to or larger than the maximum amplitude of the additional noise current, the effect similar to that of the first embodiment can be achieved.

Although two electrodes are provided according to the first embodiment, the number of electrodes is not limited to two. Any semiconductor laser having two or more electrodes and having a self-pulsating state can achieve the effect of reducing noise.

Moreover, even if the additional noise current is injected into saturable absorber region 4 and the modulation current is injected into the light-amplifying region, a resultant optical output has the effect of reducing noise. In this case, since the range of the value of the current which can be injected into saturable absorber region 4 is narrow, it is difficult to appropriately determine the intensity of a modulated optical output. However, the timing at which the lasing threshold of the laser takes the minimum value (that varies depending on the amount of injected additional noise) is stochastically synchronized with the maximum value of the modulation current, so that the injection current becomes larger/smaller than the rising threshold Ith2 of the laser and a modulated optical output can thus be produced.

The current injected into saturable absorber region 4 may not be a constant current and may be a modulation current since the effect of reducing noise is achieved as well. In this case, although an extra modulator circuit is necessary, there is an advantage that the hysteresis can be changed by the amount of injection current and thereby characteristics of the optical output can be changed.

The semiconductor laser device may be any which does not contain nitride, for example, GaAs-based semiconductor laser. In this case, there is an advantage that any wavelength different from that of the nitride semiconductor laser can be used. In the GaAs-based semiconductor laser, a self-pulsating state is easier to produce as compared with the nitride semiconductor laser. Then, depending on the circuit configuration, power consumption of the self-pulsating laser could be smaller.

The additional noise current is added to the modulation current to be injected into light-amplifying region 3. The additional noise current, however, may be injected independently into the electrode via another circuit. In this case, an extra circuit is necessary while there is an advantage that the intensity of noise can easily be adjusted.

As heretofore discussed, according to the first embodiment, a bistable semiconductor laser which is easier to produce as compared with a self-pulsating semiconductor laser can be used to produce high-power laser light with lower power consumption, a smaller load on the circuitry and excellent noise characteristics, and thereby reduce feedback-induced noise.

Second Embodiment

Figure 7:
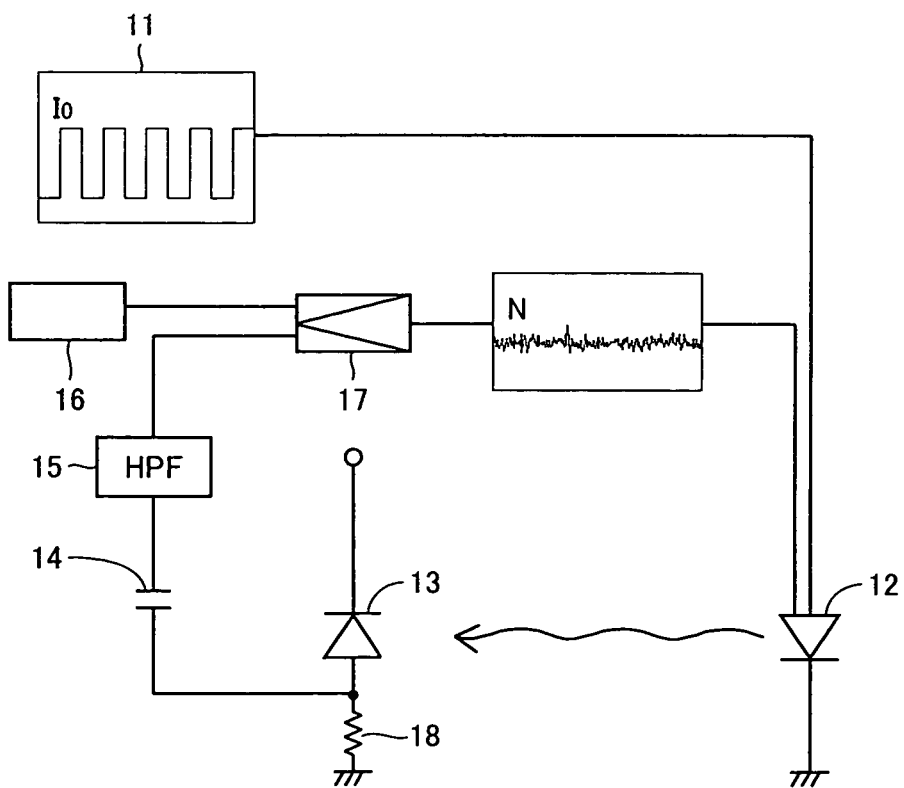
FIG. 7 shows a configuration of a semiconductor laser device and its driver circuit according to a second embodiment of the present invention.

FIG. 7 shows a configuration of a semiconductor laser device and its driver circuit according to a second embodiment of the present invention.

A semiconductor laser device 12 shown in FIG. 7 is a bistable semiconductor laser device having a saturable absorber region as described in connection with the first embodiment. An injection current I to be injected into semiconductor laser device 12 is similar to that of the first embodiment.

A modulation current supply circuit 11 is a driver circuit generating a modulation current I1 by superimposing a high-frequency current on a DC operating current, and injecting the generated current into a light-amplifying region of semiconductor laser device 12. An optical output P, which is produced by the injection of modulation current Io from modulation current supply circuit 11 into the light-amplifying region of semiconductor laser device 12, is detected by a photo-receiving device 13 grounded via a resistor 18, and is input as an electric signal to a high-pass filter 15 via a coupling capacitor 14. High-pass filter 15 extracts only a frequency component higher than the modulation frequency used in the modulation current supply circuit 11.

A preamplifier 17 determines the difference between a current having the extracted high-frequency component and a current from a reference current source 16. A resultant output with the intensity adjusted by preamplifier 17 is used as an additional noise N to be fed back into the light-amplifying region of semiconductor laser device 12. Here, the minimum amplitude of additional noise N is adjusted to 0.5 mA so that RIN of a resultant optical output has a minimum value, as done in the first embodiment.

Accordingly, a modulated optical output having a large amplitude can be produced by a cooperative effect of the modulation current and the noise that can reduce feedback-induced noise. In the second embodiment, a modulated optical output having an optical output amplitude of maximum 10 mW is produced. Here, the optical output amplitude refers to the difference between a maximum value and a minimum value of a resultant optical output.

Although the maximum amplitude of the additional noise current is adjusted to 0.5 mA by preamplifier 17 in the second embodiment, the maximum amplitude is not limited to this. The noise intensity may be any which provides a resultant optical output having a value of RIN that is required for a pickup for an optical disk.

In this case, a modulated optical output can be produced in the second embodiment if the maximum amplitude of the additional noise curent is equal to or smaller than the width of the hysteresis of the injection-current to optical-output characteristic curve of the semiconductor laser, namely the difference between the rising threshold and the falling threshold (Ith2-Ith1) of the hysteresis. If the maximum amplitude of the additional noise curent is equal to or smaller than the amplitude of the modulation current, the amplitude of an optical output can further be increased and the effect of reducing noise can be enhanced. Thus, such an amplitude of the noise is desirable.

As discussed above, according to the second embodiment, a bistable semiconductor laser which is easier to produce as compared with a self-pulsating semiconductor laser can be used to produce high-power laser light with lower power consumption, a smaller load on the circuitry and excellent noise characteristics, and thereby reduce feedback-induced noise.

Further, since the optical output of the semiconductor laser is used to produce the additional noise, the additional noise can be generated with a simple device configuration.

Third Embodiment

Figure 8:
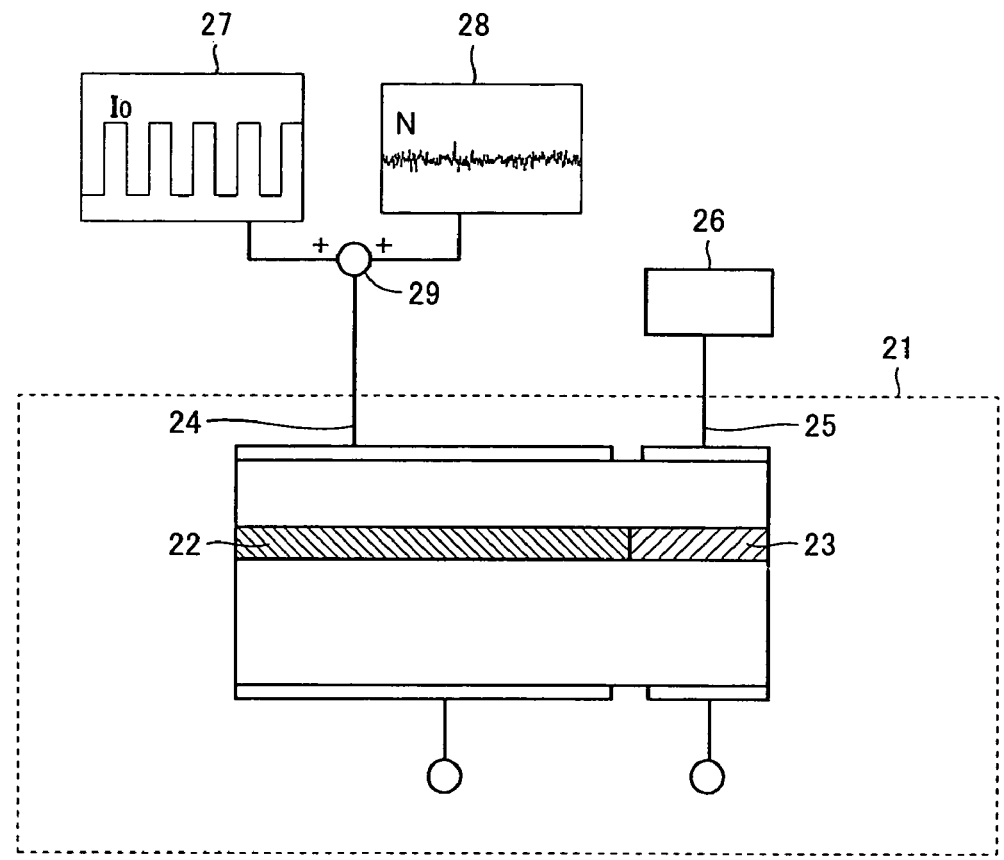
FIG. 8 shows a configuration of a semiconductor laser device and its driver circuit according to a third embodiment of the present invention.

FIG. 8 shows a configuration of a semiconductor laser device and its driver circuit according to a third embodiment of the present invention.

A semiconductor laser device 21 shown in FIG. 21 is a bistable semiconductor laser device having a saturable absorber region as provided in the first embodiment of the present invention.

As the semiconductor laser device of the first embodiment, semiconductor laser device 21 shown in FIG. 8 has an active layer constituted of a light-amplifying region 22 and a saturable absorber region 23 arranged in the direction of the resonator, and has p-electrodes 24 and 25 provided respectively for light-amplifying region 22 and saturable absorber region 23 and formed separately and independently of each other. To p-electrode 24, a modulation current supply circuit 27 and an additional noise supply circuit 28 are connected via a coupling unit 29.

Modulation current supply circuit 27 employed in the third embodiment generates a modulation current Io by superimposing a high-frequency current on a DC operating current. Additional noise supply circuit 28 can generate a current N which is the additional noise having an intensity change of white noise. A constant current source 26 is connected to p-electrode 25.

An operation of the third embodiment is now described.

Modulation current Io generated by modulation current supply circuit 27 and current N which is the additional noise generated by additional noise supply circuit 28 are superimposed by coupling unit 29. A resultant injection current to semiconductor laser device 21 is injected into light-amplifying region 22 via p-electrode 24. According to the third embodiment, the current injected into light-amplifying region 22 of semiconductor laser device 21 is driven as done in the first embodiment.

From constant current source 26, a constant current is injected into saturable absorber region 23 via p-electrode 25. According to the third embodiment, the current generated by constant current source 26 has a value of 1.0 mA. As the first embodiment, a cooperative effect of the modulation current and the noise, a modulated optical output having an amplitude which is large enough to reduce feedback-induced noise can be produced. In the third embodiment, a modulated optical output of maximum 10 mW can be produced.

Although the value of the constant current supplied to saturable absorber region 23 is 1.0 mA in the third embodiment, this value is not limited thereto. The same effect as that of the third embodiment can be achieved if the width of the hysteresis of the injection-current to optical output characteristic curve of the semiconductor laser, which varies depending on the value of the injection current injected into saturable absorber region 23, is equal to or larger than the maximum amplitude of the additional noise current.

As discussed above, according to the third embodiment, a bistable semiconductor laser which is easier to produce as compared with a self-pulsating semiconductor laser can be used to produce high-power laser light with lower power consumption, a smaller load on the circuitry and excellent noise characteristics, and thereby reduce feedback-induced noise.

Further, since the modulation current and the noise current are generated independently of each other and then coupled, various parameters of the currents each can freely be adjusted.

Fourth Embodiment

Figure 9:
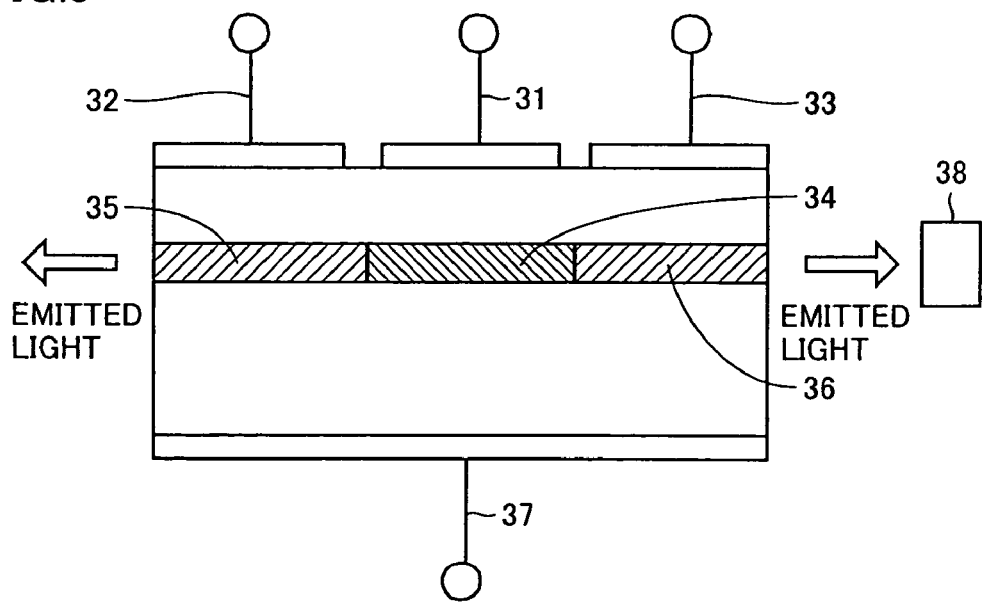
FIG. 9 is a side cross-sectional view of a resonator of a nitride semiconductor laser according to a fourth embodiment of the present invention.

FIG. 9 is a schematic side cross-sectional view of a resonator of a nitride semiconductor laser according to a fourth embodiment of the present invention.

The semiconductor laser device shown in FIG. 9 has a saturable absorber region 34 and light-amplifying regions 35 and 36 provided on lateral sides thereof in the direction of the resonator of the nitride semiconductor laser using an n-type nitride gallium substrate.

A p-electrode 31 is provided for saturable absorber region 34, p-electrodes 32 and 33 are provided respectively for light-amplifying regions 35 and 36 and an n-electrode 37 is provided on the opposite side. Saturable absorber region 34 and light-amplifying regions 34 and 35 are produced to satisfy conditions that allow the semiconductor laser to be in a bistable state. Injection of a DC current into light-amplifying regions 35 and 36 causes the laser to enter the bistable state and operate. Here, the length of saturable absorber region 34 in the direction of the resonator is approximately 10% of the entire length of the resonator.

An injection current generated by superimposing a high-frequency current on a DC operating current is injected via p-electrodes 31, 32 and 33 independently into light-amplifying regions 35 and 36. The modulation current injected into light-amplifying regions 35 and 36 has a rectangular wave and a frequency of approximately 100 MHz. A constant curent injected into saturable absorber region 34 is 1.0 mA.

Here, since the laser has a rising threshold of 20 mA and a falling threshold of 16 mA, the value of the total modulation current injected into light-amplifying regions 35 and 36 is 19.7 mA at the maximum and 15 mA at the minimum.

The maximum amplitude of the noise current added to the modulation current is adjusted to 0.5 mA so that the value of the relative noise intensity (RIN) has a minimum value. According to the fourth embodiment, as the first embodiment, a modulated optical output with an output power of 10 mW is produced. Accordingly, the effect of reducing noise similar to that of the first embodiment is achieved.

The semiconductor laser device of the fourth embodiment has laser emission surfaces as well as light-amplifying regions 35 and 36. Then, light emitted from light-amplifying region 36 is monitored by a monitor unit 38 while light emitted from light-amplifying region 35 can be used. Then, information obtained from the emitted light from light-amplifying region 36 can be used for control of the state of the emitted light from light-amplifying region 35 so that the relation between an injection current and an optical output can more precisely be known.

Although three electrodes are provided in the fourth embodiment, the number of electrodes is not limited to three. The similar effect can be achieved by any semiconductor laser having three or more electrodes and self-pulsating state.

Even if the number of electrodes is two or less, light can be divided by means of a beam splitter and a modulated output can be produced by monitoring one of the light beams obtained through the beam-splitting. An advantage here is a reduction of the electrodes which facilitates manufacture and improves the yield. According to a driving method in the fourth embodiment, a laser beam for pickup and a laser beam for monitoring can simultaneously be generated by the device itself without using the beam splitter and the like. An advantage here is that, with the simple structure, control of the optical output can be improved and the 100% of the laser power can be used.

The length of saturable absorber region 4 in the direction of the resonator may not be approximately 10% of the entire length of the resonator. Even if the length is another one, a modulated optical output can be produced with the same optical power and wavelength and the similar effect to that of the fourth embodiment can be obtained. If the ratio of the length of saturable absorber region 4 to that of the resonator is larger, however, the threshold accordingly increases which requires a greater injection current. Therefore, the length of saturable absorber region 4 is preferably at most 50% of the entire length of the resonator in the direction of the resonator.

Although white noise is used as the additional noise in the fourth embodiment, any random current having a random and non-periodic intensity change may be used as the additional noise to achieve the similar effect of reducing noise as that of the fourth embodiment.

Modulation of the operating current to be injected into light-amplifying regions 35 and 36 may done by any wave except for the rectangular wave. However, by the similar function to that of the first embodiment, the modulation by the rectangular wave provides a higher optical output and a sharper pulse waveform. The rectangular wave is thus preferred since a modulated optical output can be produced with a lower current and driving of the laser can be done with the additional noise intensity in a wider range, so that a wider range of parameters are available in driving and reduction of noise is facilitated.

In the fourth embodiment, the maximum amplitude of the additional noise current is set to 0.5 mA so that the intensity of the additional noise is equal to the optimum noise intensity Dm which allows RIN to be minimum. However, the noise intensity is not limited to such a value on the condition that a resultant optical output has a value of the RIN that is required for the optical disk pickup.

In this case, according to the fourth embodiment, if the maximum amplitude of the current, which is the additional noise, is equal to or smaller than the width of the hysteresis shown by the injection-current to optical-output characteristics of the semiconductor laser, namely the difference (Ith2−Ith1) between the rising threshold and the falling threshold of the hysteresis, a modulated optical output can be produced. If the maximum amplitude of the additional noise current is equal to or smaller than the amplitude of the modulation current, an optical output can have a larger amplitude and thus the effect of reducing noise can be improved. Therefore, such an amplitude is desirable.

The frequency of the modulation current injected into light-amplifying regions 35 and 36 may not be approximately 100 MHz which is used in the fourth embodiment, and thus may be any frequency which can produce a modulated optical output having the effect of reducing feedback-induced noise.

Although the total value of the modulation current which is injected into light-amplifying regions 35 and 36 is 19.7 mA at the maximum in the fourth embodiment, the value is not limited to this. Suppose that there is an injection-current to optical-output characteristic curve when a certain current is injected into saturable absorber region 34. Then, if a modulation current supplied to light-amplifying regions 35 and 36 has its intensity to the degree that transition to the upper hysteresis path does not occur, the effect similar to that of the fourth embodiment is achieved.

In the fourth embodiment, the value of the modulation current supplied to light-amplifying regions 35 and 36 is 15 mA at the minimum. The value is not limited to this. Suppose that there is an injection-current to optical-output characteristic curve when a certain current is injected into saturable absorber region 34. Then, if the minimum value of the modulation current supplied to light-amplifying regions 35 and 36 is equal to the rising threshold Ith2 or smaller of the hysteresis, a resultant optical output has the effect of reducing noise. However, if the minimum value of the modulation current injected into light-amplifying regions 35 and 36 is equal to or smaller than the falling threshold Ith1 of the hysteresis, the minimum value of the optical output decreases and the amplitude of the optical output increases so that the effect of reducing noise can be improved.

In the fourth embodiment, the value of the injection current injected into saturable absorber region 34 is 1.0 mA. The value, however, is not limited to this. If the width of the hysteresis of the injection-current to optical-output characteristic curve of the semiconductor laser, which is determined by the value of the injection current to the saturable absorber region 34, is equal to or larger than the maximum amplitude of the additional noise current, the effect similar to that of the fourth embodiment can be achieved.

The current is injected into saturable absorber region 34 independently of the curent injected into light-amplifying regions 35 and 36. A resultant advantage here is that driving with a lower current is possible through control of the hysteresis to decrease the lasing threshold and that adjustment of the amplitude of the optical output is possible.

Although two electrodes are provided according to the fourth embodiment, the number of electrodes is not limited to two. Any semiconductor laser having two or more electrodes and having a self-pulsating state can achieve the effect of reducing noise.

Moreover, even if the additional noise current is injected into saturable absorber region 34 and the modulation current is injected into the light-amplifying regions, a resultant optical output has the effect of reducing noise. In this case, since the range of the value of the current which can be injected into saturable absorber region 34 is narrow, the it is difficult to appropriately determine the value of the current. The timing at which the lasing threshold of the laser takes the minimum value (that varies depending on the amount of injected additional noise) is stochastically synchronized with the maximum value of the modulation current, so that the injection current becomes larger/smaller than the rising threshold of the hysteresis and a modulated optical output can thus be produced.

The current injected into saturable absorber region 34 may not be a constant current and may be a modulation current since the effect of reducing noise is achieved as well. In this case, although an extra modulator circuit is necessary, there is an advantage that the hysteresis can be changed by the amount of injection current and thereby characteristics of the optical output can be changed.

The semiconductor laser device may be any which does not contain nitride, for example, GaAs-based semiconductor laser. In this case, there is an advantage that any wavelength different from that of the nitride semiconductor laser can be used. In the GaAs-based semiconductor laser, a self-pulsating state is easier to produce as compared with the nitride semiconductor laser. Then, depending on the circuit configuration, power consumption of the self-pulsating laser could be smaller.

The additional noise current is added to the modulation current to be injected into light-amplifying regions 35 and 36. The additional noise current, however, may be injected independently into the electrode via another circuit. In this case, an extra circuit is necessary while there is an advantage that the intensity of noise can easily be adjusted.

As heretofore discussed, according to the fourth embodiment, a bistable semiconductor laser which is easier to produce as compared with a self-pulsating semiconductor laser can be used to produce high-power laser light with lower power consumption, a smaller load on the circuitry and excellent noise characteristics, and thereby reduce feedback-induced noise.

Further, it is possible to reflect fluctuations of an optical output due to external factors like a change in temperature on adjustment of the injection current by means of a feedback circuit for example, and accordingly adjustment to keep a constant optical output is facilitated.

Fifth Embodiment

Figure 10:
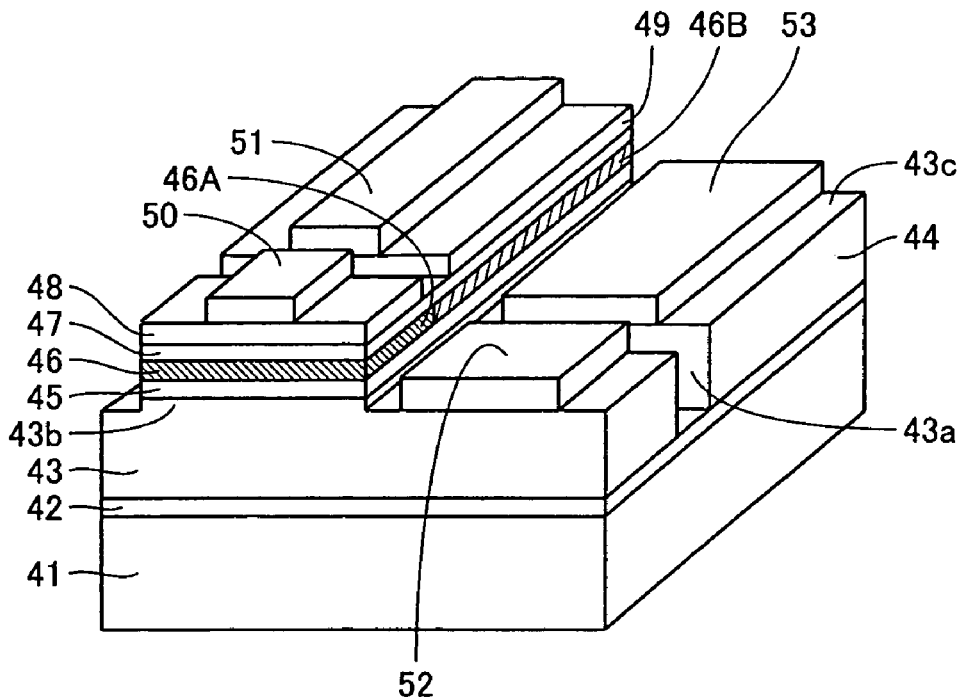
FIG. 10 is a perspective view showing a structure of a semiconductor laser device according to a fifth embodiment of the present invention.
Figure 11:
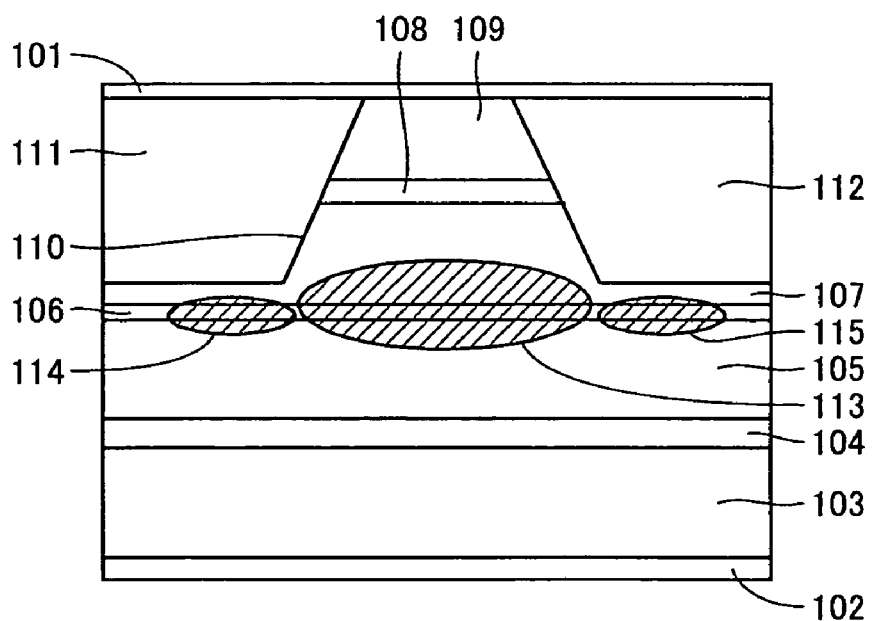
FIG. 11 is a cross-sectional view exemplarily showing a structure of a conventional self-pulsating semiconductor laser.
Figure 12:
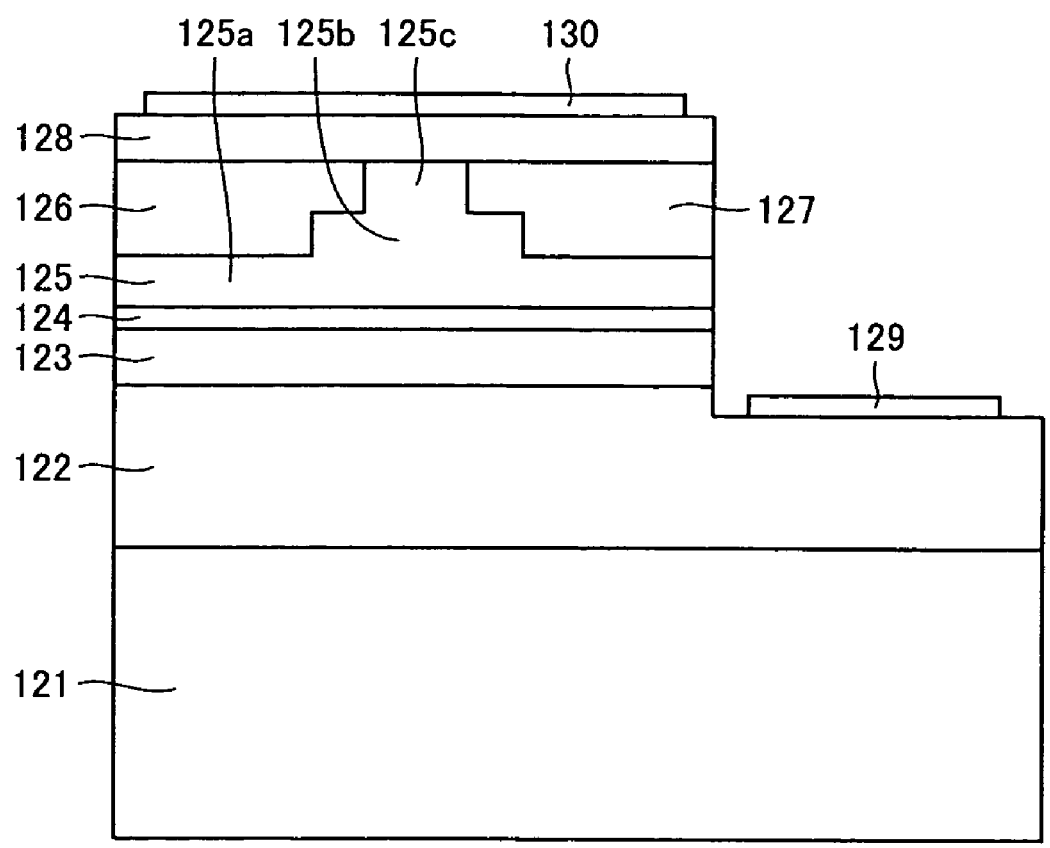
FIG. 12 is a cross-sectional view showing a structure of a conventional nitride semiconductor laser device.
Figure 13:
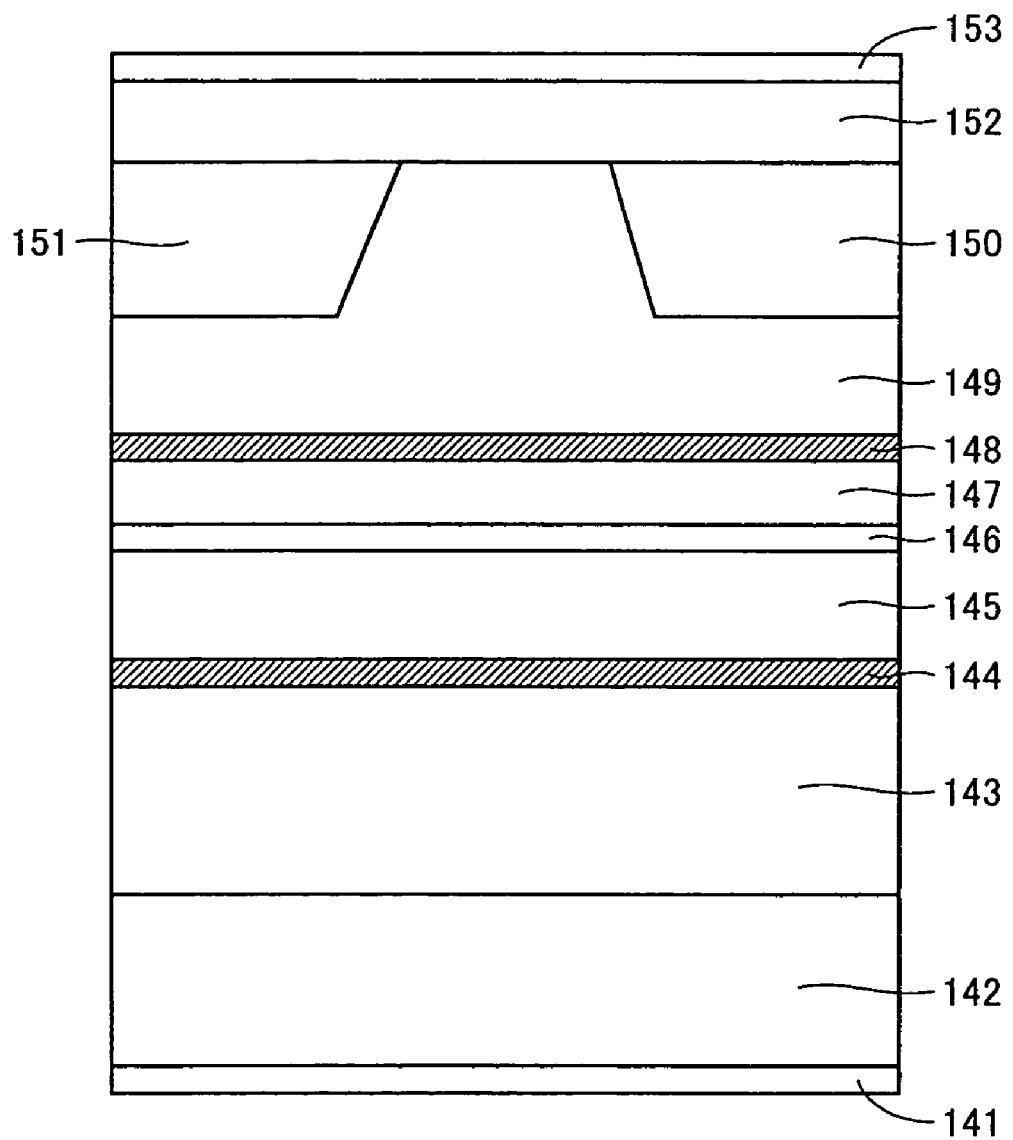
FIG. 13 is a cross-sectional view showing a structure of a conventional self-pulsating semiconductor laser device.

A semiconductor laser of a fifth embodiment is similar to that of the first embodiment except for the stacked structure shown in FIG. 10 employed in the structure of the semiconductor laser device. Then, a modulated optical output is produced by the same driving method to that of the first embodiment.

FIG. 10 is a perspective view of the structure of the semiconductor laser device according to the fifth embodiment of the present invention.

As shown in FIG. 10, the semiconductor laser device of the fifth embodiment has a planar sapphire substrate 41. A GaN buffer layer 42 is provided to cover the top surface of sapphire substrate 41. On GaN buffer layer 42, n-type GaN contact layers 43 and 44 are provided. In n-type GaN contact layer 43, a cut 43a is made to extend in one direction. Cut 43a partially exposes GaN buffer layer 42. Cut 43a extends to reach a protrusion 43b of n-type GaN contact layer 43.

N-type GaN contact layers 43 and 44 have top surface 43c provided with n-electrodes 52 and 53 separated from each other by cut 43a.

Protrusion 43b extends perpendicularly to cut 43a. On protrusion 43b, an n-type cladding layer 45 is provided. On n-type cladding layer 45, an active layer of a multiple quantum well structure (hereinafter multiple-quantum-well active layer) 46 formed of an $In_{0.2}Ga_{0.8}N$ quantum well layer and an $In_{0.05}Ga_{0.95}N$ barrier layer is formed. Multiple-quantum-well active layer 46 is formed of two regions, i.e., a saturable absorber region 46A and a light-amplifying region 46B.

Saturable absorber region 46A and light-amplifying region 46B are produced under conditions that allow the semiconductor laser to be in a bistable state. Here, the length of saturable absorber region 46A in the direction of the resonator is 10% of the entire length of the resonator.

On multiple-quantum-well active layer 46, a p-type cladding layer 47 is formed. On p-type cladding layer 47, p-type GaN contact layers 48 and 49 are formed separately from each other. On p-type GaN contact layers 48 and 49, p-electrodes 50 and 51 are formed respectively.

According to the fifth embodiment, protrusion 43b is formed to extend perpendicularly to cut 43a. The direction in which protrusion 43b extends, however, is not limited to this and protrusion 43b may extend to form an acute angle with respect to cut 43b.

When a potential difference between p-electrode 50 and n-electrode is established, this potential difference is applied to saturable absorber region 46A. When a potential difference between p-electrode 51 and n-electrode 53 is established, this potential difference is applied to light-amplifying region 46B.

The length in the direction of the resonator, the carrier lifetime and the differential gain of saturable absorber region 46A and light-amplifying region 46B each are defined to satisfy the conditions for ensuring the bistable state, so that injection of a DC current into light-amplifying region 46B causes the semiconductor laser to enter the bistable state. Further, impurities are added to a region of the active layer that serves as saturable absorber region 46A in order to adjust the carrier lifetime. Here, $1 \times 10^{19}$ cm$^{-3}$ of Si is added.

As heretofore discussed, according to the fifth embodiment, a bistable semiconductor laser which is easier to produce as compared with a self-pulsating semiconductor laser can be used to produce high-power laser light with lower power consumption, a smaller load on the circuitry and excellent noise characteristics, and thereby reduce feedback-induced noise.

The contact layers and electrodes are provided in the upper part of the device. Then, although manufacturing of the device is somewhat complicated, an advantage is that integration of the device is facilitated.

The present invention is applicable to nitride semiconductor lasers as well as lasers of other materials such as AlGaAs-based, AlGaInP-based, GaN-based and II-VI0-based lasers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser reducing feedback-induced noise by a modulated optical output, comprising:
   an active layer having a light-amplifying region and a saturable absorber region formed to allow said semiconductor laser to be in a bistable state and to increase an amplitude of an optical output;
   a stochastic resonance electrode of a first polarity configured to inject a current generated by superimposing a noise current on a modulation current into said active layer and to control hysteresis by adjusting the intensity of said modulation current and the intensity of said noise current with respect to each other; and
   a stochastic resonance electrode of a second polarity provided in relation to said stochastic resonance electrode of the first polarity, wherein
   at least one of said stochastic resonance electrode of the first polarity and said stochastic resonance electrode of the second polarity is divided to allow said current to be injected independently into said light-amplifying region and said saturable absorber region, wherein said stochastic resonance electrodes control said hysteresis to adjust the lasing threshold of the laser and produce said optical output modulated as a stochastic resonance.

2. The semiconductor laser according to claim 1, wherein said modulation current has a rectangular wave.

3. The semiconductor laser according to claim 1, wherein said noise current has a random intensity change.

4. The semiconductor laser according to claim 1, wherein a ratio of the length of said saturable absorber region to the entire length of a resonator in the direction of the resonator is at least 1% and at most 50%.

5. The semiconductor laser according to claim 1, wherein a difference between a maximum value and a minimum value of said noise current is at most an amplitude of said modulation current injected into said light-amplifying region.

6. The semiconductor laser according to claim 1, wherein the hysteresis is controlled by adjusting the noise current until it is stochastically synchronized with the maximum value of the modulated current.

* * * * *